US008514373B2

(12) United States Patent
Shibazaki

(10) Patent No.: US 8,514,373 B2
(45) Date of Patent: Aug. 20, 2013

(54) MOVABLE BODY SYSTEM, PATTERN FORMATION APPARATUS, EXPOSURE APPARATUS AND EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 237 days.

(21) Appl. No.: 12/805,945

(22) Filed: Aug. 25, 2010

(65) Prior Publication Data

US 2010/0321666 A1 Dec. 23, 2010

Related U.S. Application Data

(63) Continuation of application No. 11/905,379, filed on Sep. 28, 2007, now Pat. No. 7,999,918.

(30) Foreign Application Priority Data

Sep. 29, 2006 (JP) .................. 2006-266564
Dec. 28, 2006 (JP) .................. 2006-356571

(51) Int. Cl.
*G02B 27/58* (2006.01)
*G02B 27/42* (2006.01)
*G01B 11/14* (2006.01)
*G03F 7/20* (2006.01)

(52) U.S. Cl.
CPC ........ *G03F 7/70775* (2013.01); *G03F 7/70758* (2013.01)
USPC ................. 355/72; 355/53; 356/616

(58) Field of Classification Search
CPC .............. G03F 7/70775; G03F 7/70758
USPC ............ 355/53, 72; 356/401, 445–448, 356/493, 494, 496, 498, 499, 614, 615, 622, 356/616

See application file for complete search history.

(56) References Cited

U.S. PATENT DOCUMENTS

| 4,775,877 A | 10/1988 | Kosugi et al. |
| 4,780,617 A | 10/1988 | Umatate et al. |

(Continued)

FOREIGN PATENT DOCUMENTS

| EP | 1 630 585 A1 | 3/2006 |
| JP | A-63-231217 | 9/1988 |

(Continued)

OTHER PUBLICATIONS

Office Action from parent U.S. Appl. No. 11/905,379, mailed Oct. 20, 2008.

(Continued)

*Primary Examiner* — Steven H Whitesell Gordon
(74) *Attorney, Agent, or Firm* — Oliff & Berridge, PLC

(57) ABSTRACT

A laser beam emitted by an encoder main body enters a wafer table via a PBS from the outside, and reaches a grating at a point that is located right under exposure area, and is diffracted by the grating. Then, by receiving interference light of a first polarized component that has returned from the grating and a second polarized component reflected by the PBS, positional information of the wafer table is measured. Accordingly, because the first polarized component, which has passed through PBS passes through the wafer table until it is synthesized with the second polarized component again, does not proceed through the atmosphere outside, position measurement of the wafer table can be performed with high precision without the measurement beam being affected by the fluctuation of the atmosphere around the wafer table.

85 Claims, 10 Drawing Sheets

(56) References Cited

U.S. PATENT DOCUMENTS

| | | | |
|---|---|---|---|
| 5,021,649 | A | 6/1991 | Nishimura et al. |
| 5,309,198 | A | 5/1994 | Nakagawa |
| 5,579,111 | A | 11/1996 | Maeda |
| 5,610,715 | A | 3/1997 | Yoshii et al. |
| 5,666,196 | A | 9/1997 | Ishii et al. |
| 5,969,441 | A | 10/1999 | Loopstra et al. |
| 6,032,997 | A | 3/2000 | Elliott et al. |
| 6,208,407 | B1 | 3/2001 | Loopstra |
| 6,590,634 | B1 | 7/2003 | Nishi et al. |
| 6,597,002 | B1 * | 7/2003 | Kondo ............... 250/492.2 |
| 6,611,316 | B2 | 8/2003 | Sewell |
| 6,778,257 | B2 | 8/2004 | Bleeker et al. |
| 6,819,425 | B2 | 11/2004 | Kwan |
| 6,897,963 | B1 | 5/2005 | Taniguchi et al. |
| 7,023,610 | B2 | 4/2006 | Ohtsuki et al. |
| 7,025,498 | B2 | 4/2006 | del Puerto |
| 7,102,729 | B2 | 9/2006 | Renkens et al. |
| 7,161,659 | B2 | 1/2007 | Van Den Brink et al. |
| 7,238,931 | B2 | 7/2007 | Nabeshima et al. |
| 7,253,875 | B1 | 8/2007 | Luttikhuis et al. |
| 7,256,871 | B2 | 8/2007 | Loopstra et al. |
| 7,289,212 | B2 | 10/2007 | Kwan |
| 7,292,312 | B2 | 11/2007 | Loopstra et al. |
| 7,333,174 | B2 | 2/2008 | Koenen et al. |
| 7,348,574 | B2 | 3/2008 | Pril et al. |
| 7,349,069 | B2 | 3/2008 | Beems et al. |
| 7,362,446 | B2 | 4/2008 | Van Der Pasch et al. |
| 7,405,811 | B2 | 7/2008 | Beems et al. |
| 7,486,385 | B2 | 2/2009 | Ebihara |
| 2002/0041380 | A1 | 4/2002 | Kwan |
| 2002/0176096 | A1 | 11/2002 | Sentoku et al. |
| 2002/0196421 | A1 | 12/2002 | Tanaka et al. |
| 2005/0128461 | A1 | 6/2005 | Beems et al. |
| 2005/0259234 | A1 | 11/2005 | Hirukawa et al. |
| 2006/0023178 | A1 | 2/2006 | Loopstra et al. |
| 2006/0023194 | A1 | 2/2006 | Loopstra et al. |
| 2006/0139595 | A1 | 6/2006 | Koenen et al. |
| 2006/0139660 | A1 | 6/2006 | Patrick Kwan |
| 2006/0170892 | A1 | 8/2006 | Koenen et al. |
| 2006/0227309 | A1 | 10/2006 | Loopstra et al. |
| 2006/0238731 | A1 | 10/2006 | Beems et al. |
| 2006/0238733 | A1 | 10/2006 | Beems et al. |
| 2007/0035267 | A1 | 2/2007 | Gao et al. |
| 2007/0041024 | A1 * | 2/2007 | Gao et al. ............... 356/616 |
| 2007/0052976 | A1 | 3/2007 | Pril et al. |
| 2007/0076218 | A1 | 4/2007 | Van Empel et al. |
| 2007/0153253 | A1 | 7/2007 | Van Buel et al. |
| 2007/0195296 | A1 | 8/2007 | Van Der Pasch et al. |
| 2007/0223007 | A1 | 9/2007 | Klaver et al. |
| 2007/0263191 | A1 | 11/2007 | Shibazaki |
| 2007/0263197 | A1 | 11/2007 | Luttikhuis et al. |
| 2007/0288121 | A1 | 12/2007 | Shibazaki |
| 2008/0043212 | A1 | 2/2008 | Shibazaki |
| 2008/0088843 | A1 | 4/2008 | Shibazaki |

FOREIGN PATENT DOCUMENTS

| | | |
|---|---|---|
| JP | A-1-272917 | 10/1989 |
| JP | A-3-18720 | 1/1991 |
| JP | A-04-265805 | 9/1992 |
| JP | A-10-38517 | 2/1998 |
| JP | A-2002-151405 | 5/2002 |
| JP | A-2003-149005 | 5/2003 |
| JP | A-2003-166856 | 6/2003 |
| JP | A-2004-101362 | 4/2004 |
| JP | A-2006-292728 | 10/2006 |
| JP | A-2007-093546 | 4/2007 |
| WO | WO 01/35168 A1 | 5/2001 |
| WO | WO 2004/053955 A1 | 6/2004 |
| WO | WO 2004/107011 A1 | 12/2004 |
| WO | WO 2006/038952 A2 | 4/2006 |
| WO | PCT/JP2007/068933 | 9/2007 |

OTHER PUBLICATIONS

Office Action from parent U.S. Appl. No. 11/905,379, mailed Jan. 15, 2009.

Written Opinion (PCT/ISA/237) cited in International Searching Authority issued for PCT Application No. PCT/JP2007/068933 dated Dec. 18, 2007.

International Search Report cited in International Searching Authority issued for PCT Application No. PCT/JP2007/068933 dated Dec. 18, 2007.

Office Action from related U.S. Appl. No. 11/905,379, mailed Nov. 6, 2009.

Translation of JP-A-03-018720, dated Jan. 28, 1991.

Translation of JP-A-2002-151405, dated May 24, 2002.

Jun. 1, 2012 Notification of Reason(s) for Refusal issued in Japanese Patent Application No. 2008-536436 w/translation.

* cited by examiner

MOVABLE BODY SYSTEM, PATTERN FORMATION APPARATUS, EXPOSURE APPARATUS AND EXPOSURE METHOD, AND DEVICE MANUFACTURING METHOD

This is a Continuation of application Ser. No. 11/905,379 filed Sep. 28, 2007. The disclosure of the prior application is hereby incorporated by reference herein in its entirety.

BACKGROUND

1. Field of the Invention

The present invention relates to movable body systems, pattern formation apparatus, exposure apparatus and exposure methods, and device manufacturing methods, and more particularly to a movable body system equipped with a movable body which moves holding an object, a pattern formation apparatus equipped with the movable body system, an exposure apparatus equipped with the movable body system and an exposure method in which an energy beam is irradiated on an object so as to form a predetermined pattern on the object, and a device manufacturing method using the exposure method.

2. Description of the Background Art

Conventionally, in a lithography process for manufacturing microdevices (electron devices and the like) such as semiconductor devices and liquid crystal display devices, exposure apparatuses such as a reduction projection exposure apparatus by a step-and-repeat method (a so-called stepper) and a reduction projection exposure apparatus by a step-and-scan method (a so-called scanning stepper (which is also called a scanner)) are relatively frequently used.

In this kind of exposure apparatus, in order to transfer a pattern of a reticle (or a mask) on a plurality of shot areas on an object subject to exposure such as a wafer or a glass plate (hereinafter, generally referred to as a wafer), a wafer stage holding the wafer is driven in an XY two-dimensional direction, for example, by linear motors and the like. Position measurement of such a wafer stage was generally performed using a laser interferometer whose stability of measurement values was good for over a long time and had a high resolution.

However, requirements for a stage position control with higher precision are increasing due to finer patterns that accompany higher integration of semiconductor devices, and now, short-term variation of measurement values due to temperature fluctuation of the atmosphere on the beam path of the laser interferometer and/or the influence of temperature gradient has come to occupy a large percentage in the overlay budget.

Meanwhile, as a measurement unit besides the laser interferometer used for position measurement of the stage, an encoder can be used, however, because the encoder uses a scale, which lacks in mechanical long-term stability (drift of grating pitch, fixed position drift, thermal expansion and the like), it makes the encoder have a drawback of lacking measurement value linearity and being inferior in long-term stability when compared with the laser interferometer.

In view of the drawbacks of the laser interferometer and the encoder described above, various proposals are being made (refer to U.S. Pat. No. 6,819,425 description, Kokai (Japanese Patent Unexamined Application Publication) No. 2004-101362 bulletin and the like) of a unit that measures the position of a stage using both a laser interferometer and an encoder (a position detection sensor which uses a diffraction grating) together. Especially, encoders that have a measurement resolution nearly equal to or better than the laser interferometer have appeared (for example, refer to U.S. Pat. No. 7,238,931 description and the like) these days, and the technology to put the laser interferometer and the encoder described above together is beginning to gather attention.

However, in the case a mirror of the interferometer or a scale (such as a grating) of the encoder is arranged on the outside, such as, for example, on the side surface of a stage, a position (positional relation with a predetermined point on the stage) on the stage changes along with the minute deformation of the stage which occurs when the stage is accelerated, which makes the probability high of a decrease in the position measurement precision of the stage. Further, for example, from the viewpoint of improving throughput, even if a new technology was proposed of beginning exposure during the acceleration of the wafer stage in a scanning stepper, there is a risk that the change of the position of the mirror or the scale on the stage that accompanies the acceleration of the stage described above will become an obstacle factor when practicing the new technology.

SUMMARY

The present invention has been made in consideration of the circumstances described above, and according to the first aspect of the present invention, there is provided a movable body system, the system comprising: a movable body that is movable substantially along a predetermined plane holding an object, and has a grating placed along a plane on a rear surface side of the object substantially parallel with the predetermined plane, and light that has entered from the outside can proceed inside toward the grating; and a measurement system that makes light enter the inside of the movable body from the outside, and measures positional information of the movable body in a measurement direction in the predetermined plane by receiving light including a reflected light from the grating.

According to this movable body system, the measurement system makes light enter the inside of the movable body holding the object from the outside, and positional information of the movable body in the measurement direction in the predetermined plane is measured by receiving the light including the reflected light from a grating arranged on the rear surface of the object. Accordingly, position measurement of the movable body with high precision becomes possible without receiving almost any effect of fluctuation and the like of the atmosphere around the movable body.

According to a second aspect of the present invention, there is provided a pattern formation apparatus, comprising: a movable body system of the present invention, in which for pattern formation to an object, the object is held by the movable body.

According to this apparatus, because the apparatus is equipped with the movable body and the movable body system which can perform position measurement of object held by the movable body with high accuracy, it becomes possible to perform formation of the pattern on the object with high precision.

According to a third aspect of the present invention, there is provided an exposure apparatus that forms a pattern on an object by an irradiation of an energy beam, the apparatus comprising: a patterning unit that irradiates the energy beam on the object; and a movable body system according to the present invention, wherein a movable body that holds the object of the movable body system is driven for relative movement of the energy beam and the object.

According to this apparatus, because the apparatus is equipped with the movable body and the movable body system which can perform position measurement of object held by the movable body with high accuracy, and the movable body is driven using the movable body system so that the energy beam and the object perform relative movement, it becomes possible to form a pattern on the object with high precision using the patterning unit.

According to a fourth aspect of the present invention, there is provided a first exposure method in which an energy beam is irradiated on an object so as to form a predetermined pattern on the object wherein a movable body that holds the object and also has a grating placed along a surface substantially parallel to a predetermined plane on a rear surface side of the object, and in which light entering from the outside can proceed toward the grating in the inside, is moved along the predetermined plane, and light is made to enter the inside of the movable body from the outside, and positional information of the movable body in a measurement direction in the predetermined plane is measured by receiving light including a reflected light from the grating.

According to this method, because in the movable body, positional information of the movable body is measured by placing a grating on the rear surface side of the object, making the light enter the inside of the movable body from the outside and receiving the light including the reflected light from a measurement point on the grating, position measurement of the movable body with high precision without receiving almost any effect of fluctuation and the like of the atmosphere around the movable body, which leads to exposure (pattern formation) with high precision, becomes possible.

According to a fifth aspect of the present invention, there is provided a second exposure method in which an energy beam is irradiated on an object so as to form a predetermined pattern on the object wherein a first and second lights are made to enter the inside of a movable body that holds the object and can move in a predetermined plane, and has a grating placed along a surface substantially parallel to the predetermined plane on the rear surface side of the object, and positional information of the movable body in the measurement direction in the predetermined plane is measured using a first and second measurement unit which receive the light proceeding in the inside and is reflected by the grating, and a measurement of the positional information of the movable body using one of the first and second measurement units is switched to a measurement of the positional information of the movable body using the other measurement unit of the first and second measurement units.

According to this method, because switching is performed from a measurement of the positional information of the movable body using one of the measurement units of the first and second measurement units to a measurement of the positional information of the movable body using the other measurement unit, position control of the movable body can be performed without any problems in particular even if the size of the movable body is reduced.

According to a sixth aspect of the present invention, there is provided a device manufacturing method, the method comprising: exposing a substrate using an exposure method according to one of the first and second exposure methods of the present invention; and developing a substrate which has been exposed.

According to a seventh aspect of the present invention, there is provided a device manufacturing method, the method comprising: exposing a substrate using an exposure apparatus according to the present invention; and developing a substrate which has been exposed.

BRIEF DESCRIPTION OF THE DRAWINGS

In the accompanying drawings.

DETAILED DESCRIPTION OF EMBODIMENTS

A First Embodiment

An embodiment of the present invention will be described below, with reference to FIGS. 1 to 3C.

Figure 1:
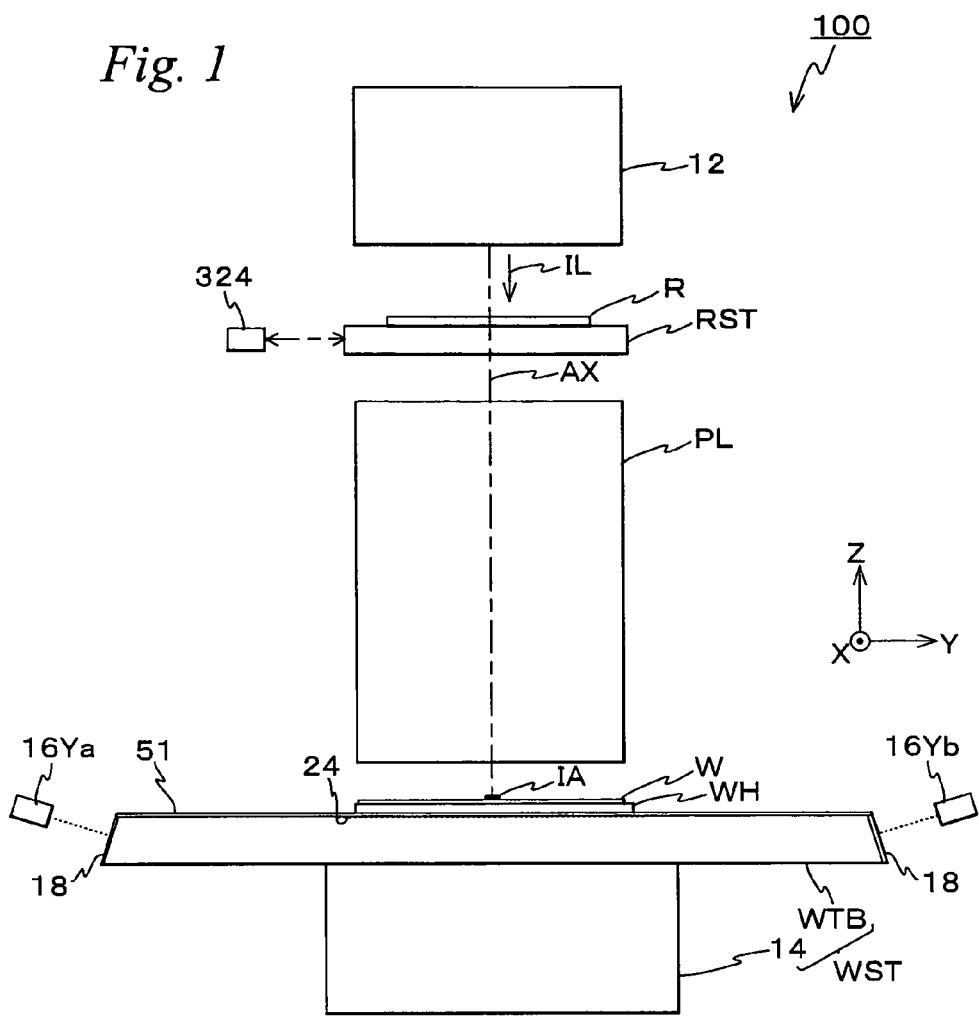
FIG. 1 is a schematic view that shows an exposure apparatus related to a first embodiment.

FIG. 1 shows a schematic configuration of an exposure apparatus 100 related to the first embodiment of the present invention. Exposure apparatus 100 is a reduction projection exposure apparatus by a step-and-scan method. Exposure apparatus 100 is equipped with an illumination system 12 including a light source and an illumination optical system and illuminates a reticle R by an illumination light IL, a reticle stage RST that holds reticle R, a projection optical system PL, a wafer stage WST that holds wafer W, a controller (not shown) which has overall control over the system and the like. In the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Illumination system 12 illuminates a slit-shaped illumination area extending in the X-axis direction on reticle R set by a reticle blind (not shown), with an approximately uniform illumination by illumination light IL. In this case, as illumination light IL, for example, an ArF excimer laser beam (wavelength 193 nm) is used.

On reticle stage RST, reticle R on which a circuit pattern or the like is drawn is fixed, for example, by vacuum suction or the like. For position control of reticle R, reticle stage RST is finely drivable in the XY plane which is perpendicular to an optical axis (coinciding with optical axis AX of projection optical system PL described below) of illumination system 12 by a reticle stage drive system (not shown), and is drivable at a designated scanning speed in a predetermined scanning direction (in this case, the Y-axis direction, which is the lateral direction in the page surface of FIG. 1).

The position of reticle stage RST in the movement plane is constantly detected by a reticle laser interferometer (hereinafter called a "reticle interferometer") 324 via a side surface of reticle stage RST at a resolution of, for example, around 0.5 to 1 nm. The positional information of reticle stage RST from reticle interferometer 324 is sent to the controller (not shown). The controller drives reticle stage RST via the reticle stage drive system, based on positional information of reticle stage RST.

As projection optical system PL, for example, a dioptric system is used, consisting of a plurality of lenses (lens elements) that is disposed along optical axis AX, which is parallel to the Z-axis direction. Projection optical system PL is, for example, both-side telecentric, and has a predetermined projection magnification (such as one-quarter or one-fifth times). Therefore, when illumination light IL from illumination system 12 illuminates the illumination area, a reduced image of the circuit pattern (a reduced image of a part of the circuit pattern) of the reticle is formed within the illumination area with illumination light IL that has passed through reticle R which is placed so that its pattern surface substantially coincides with a first plane (an object plane) of projection optical system PL, in an area (exposure area IA) conjugate to the illumination area on wafer W whose surface is coated with a resist (a sensitive agent) and is placed on a second plane (an image plane side), via projection optical system PL. And by the synchronous drive of reticle stage RST and wafer stage WST, reticle R is relatively moved in the scanning direction (the Y-axis direction) with respect to the illumination area (illumination light IL) while wafer W is relatively moved in the scanning direction (the Y-axis direction) with respect to exposure area IA (illumination light IL), thus scanning exposure of a shot area (divided area) on wafer W is performed, and the pattern of the reticle is formed on the shot area. That is, in the embodiment, the pattern is generated on wafer W according to illumination system 12, reticle R, and projection optical system PL, and then by the exposure of the sensitive layer (resist layer) on wafer W with illumination light IL, the pattern is formed on wafer W.

Wafer stage WST holds wafer holder WH by suction by an electrostatic chuck mechanism (not shown) on its upper surface. Further, wafer holder WH holds wafer W by suction by the electrostatic chuck mechanism that wafer holder WH has. As shown in FIG. 1, wafer stage WST includes a stage main section 14, a wafer table WTB fixed on stage main section 14, and a freely detachable wafer holder WH which can be attached to/detached from wafer table WTB by the electrostatic chuck mechanism (not shown). Incidentally, the holding mechanism for fixing wafer holder WH to wafer table WTB is not limited to the electrostatic chuck mechanism, and for example, a vacuum chuck mechanism or a clamping mechanism can also be used. Further, wafer holder WH can be formed integral with wafer table WTB, or wafer W can be held by a mechanism different from the electrostatic chuck mechanism, such as a vacuum chuck mechanism.

Stage main section 14 (wafer stage WST) is driven in directions of six degrees of freedom, in the X-axis direction, the Y-axis direction, the Z-axis direction, the $\theta x$ direction, the $\theta y$ direction and the $\theta z$ direction by a drive system which includes a linear motor, a voice coil motor (VCM) and the like. Accordingly, wafer W can be moved in directions of six degrees of freedom. Incidentally, stage main section 14 can be driven in the X-axis direction, the Y-axis direction, and the $\theta z$ direction, and wafer table WTB can be finely driven in the Z-axis direction, the $\theta x$ direction, and the $\theta y$ direction. In this case, wafer table WTB can be finely moved in directions of six degrees of freedom.

Wafer table WTB consists of a transparent member (e.g., glass or the like), and is a plate-shaped member having a rough square shape in a planar view (when viewed from above). The length of one side of wafer table WTB is around 3 times the diameter of wafer W. Wafer holder WH is held on the upper surface in the center section of wafer table WTB. Because a laser beam for measurement of an encoder system described below travels inside wafer table WTB, wafer table WTB is configured by a transmission member transmissive to at least the laser beam for measurement. Further, wafer table WTB has a first surface (upper surface) and a second surface (lower surface) which are substantially parallel to the XY plane, a pair of sides each extending in the X-axis direction, and a pair of sides each extending in the Y-axis direction. In the embodiment, as it will be described later on, a grating 24 is formed on the upper surface of wafer table WTB, and the laser beam for measurement enters the inside of wafer table WTB from each of the four sides (hereinafter also referred to as the edge surface). Incidentally, the transmission member is preferably a material having low thermal expansion, and as an example in the embodiment, synthetic silica is used. Further, wafer table WTB can be totally configured by the transmission member, however, wafer table WTB can also be configured with only a part of wafer table WTB where the laser beam for measurement passes configured by the transmission member.

Figure 3A:
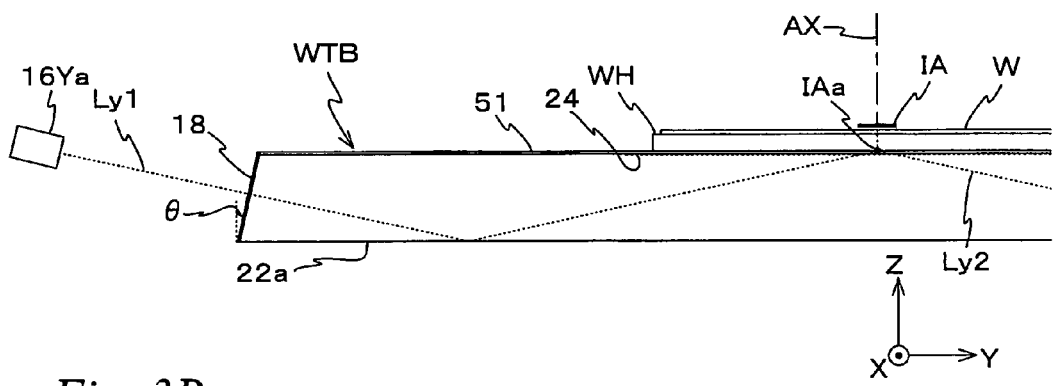
FIGS. 3A to 3C are views for describing a measurement by the encoder main body in the first embodiment.

As shown in FIG. 3A, the −Y side edge surface and the +Y side edge surface of wafer table WTB extend in the X-axis direction, and are inclined at a predetermined angle ($\theta(0°<\theta<90°)$) with respect to the XZ plane. More specifically, the −Y side edge surface and the +Y side edge surface form an angle with the bottom surface of wafer table WTB (lower surface) that is an acute angle ($90°-\theta$), in other words, the angle formed with the upper surface (a formation surface of grating 24) of wafer table WTB becomes an obtuse angle ($90°+\theta$). Furthermore, to each of the −Y side edge surface and the +Y side edge surface, a polarization filter (hereinafter also simply referred to as a "PBS") 18 is affixed. Further, although it is not shown, in a similar manner, the −X side edge surface and the +X side edge surface of wafer table WTB extend in the Y-axis direction, and are inclined at a predetermined angle ($\theta$) with respect to the YZ plane. More specifically, the −X side edge surface and the +X side edge surface form an angle with the bottom surface of wafer table WTB (lower surface) that is an acute angle ($90°-\theta$), in other words, the angle formed with the upper surface of wafer table WTB becomes an obtuse angle ($90°+\theta$). Furthermore, to each of a −X side edge face and the +X side edge face, a polarization filter (PBS) (not shown) is affixed.

PBS 18 is configured, for example, including a pair of glass plates and a polarizing film which is inserted between the pair of glass plates, and has a property of transmitting a polarized component whose vibration is in a particular direction while reflecting other polarized components. In this case, of the lights entering PBS 18, a first polarized component having vibration in a particular direction is to pass, and a second polarized component having vibration in a direction orthogonal to the first polarized component is to be reflected.

Further, on the upper surface of wafer table WTB in the center section (a section which is one size larger than wafer holder WH), a two-dimensional grating 24, which is a combination of a grating whose periodic direction is the X-axis direction and a grating whose periodic direction is the Y-axis direction, is set horizontally, and the upper surface of grating 24 is covered by a cover glass 51 serving as a protective member. In the embodiment, the above-mentioned electrostatic chuck mechanism wafer holder WH is adsorbed, and to hold is installed in the upper surface of this cover glass 51. Incidentally, in the embodiment, cover glass 51 is arranged to cover almost the entire surface of the upper surface of wafer table WTB, however, cover glass 51 can be arranged so that it covers only a part of the upper surface including grating 24. Further, in the embodiment, cover glass 51 is configured of a material the same as wafer table WTB, however, for example, cover glass 51 can be configured of other materials such as, for example, metal, ceramics or a thin film. Incidentally, wafer table WTB can include cover class 51, and in this case, the formation surface of grating 24 is to be placed inside wafer table WTB and not on the top surface of wafer table WTB.

The position of wafer stage WST in the XY plane is constantly detected via grating 24 by a main body of an encoder which will be described below. The positional information of wafer stage WST detected by the main body of this encoder is sent to the controller (not shown), and based on this positional information, the controller (not shown) controls the position of wafer stage WST by driving the linear motor and voice coil motor previously described.

The controller includes, for example, work stations (or microcomputers) and the like, and has overall control over each section that configures exposure apparatus 100 such as the detection system described above.

Next, configuration and the like of the encoder system (measurement system) used for position measurement of wafer stage WST in the first embodiment will be described in detail, using FIGS. 1 to 3C. The encoder system of the first embodiment includes grating 24 previously described, and four encoder main bodies (measurement units) 16Ya, 16Yb, 16Xa, and 16Xb (encoder main bodies 16Xa and 16Xb not shown in FIG. 1, refer to FIG. 2) which irradiate a laser beam for measurement on grating 24.

Figure 2:
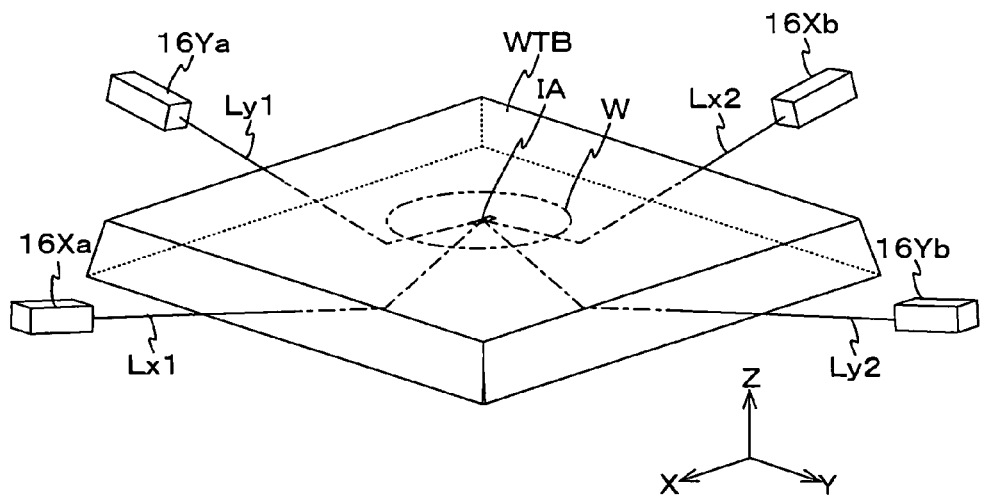
FIG. 2 is a perspective view showing a positional relation between a wafer table and an encoder main body in FIG. 1.

FIG. 2 shows a perspective view for explaining the positional relation between the four encoder main bodies 16Ya, 16Yb, 16Xa, and 16Xb. Encoder main bodies 16Ya and 16Yb are used to detect positional information of wafer table WTB (wafer W) in the Y-axis direction. As shown in FIG. 2, encoder main bodies 16Ya and 16Yb are placed at positions spaced apart at an equal interval on the −Y side and the +Y side from the center (the exposure center) of exposure area IA. Further, encoder main bodies 16Xa and 16Xb are used to detect positional information of wafer table WTB (wafer w) in the X-axis direction. As shown in FIG. 2, encoder main bodies 16Xa and 16Xb are placed at positions spaced apart at an equal interval on the −X side and the +X side from the center of exposure area IA. Incidentally, in the embodiment, the center of exposure area IA coincides with optical axis AX of projection optical system PL in the XY plane, and in the exposure operation, positioning (more specifically, alignment of wafer W) of wafer stage WST is performed with respect to the center of exposure area IA.

Now, encoder main body 16Ya will be specifically described. Although it is not shown, encoder main body 16Ya includes a photodetector, which is configured including a light source that emits a laser beam for measurement (hereinafter appropriately shortened to a laser beam), an optical system, a CCD and the like inside.

As shown in FIG. 3A, in encoder main body 16Ya, a laser beam Ly1 for measurement is emitted from the light source arranged inside encoder main body 16Ya. And as shown in FIG. 3A, laser beam Ly1 perpendicularly enters PBS18 arranged on the −Y edge surface of wafer table WTB. Then, by PBS18, laser beam Ly1 is split by polarization into a first polarized component and a second polarized component whose polarization directions are orthogonal to each other. More specifically, one of the first polarized component and the second polarized component (in this case, the first polarized component) passes PBS18, and the other polarized component (in this case, the second polarized component) is reflected by PBS18.

Then, the first polarized component (e.g., a p-polarized component) which has passed PBS18 proceeds into the inside of wafer table WTB, and then enters a bottom surface 22a at an incidence angle (90°−θ) and is reflected here and then enters grating 24 at an incidence angle (90°−θ). Then, the component is diffracted with the grating of grating 24 whose periodic direction is the Y-axis direction, and diffraction light of a predetermined order returns the same optical path as the optical path of the laser beam that had entered grating 24. Now, as is obvious from FIGS. 3A to 3C, in the embodiment, light incident on grating 24 is always set to be incident on a point IAa right under the center of an exposure area IA. The position of this point IA in the XY plane is the same as the center of exposure area IA.

Then, the return light (the return light of the light (the first polarized component) that has passed PBS18) passes the same optical path as the second polarized component (e.g., an s-polarized component) reflected by PBS18, and returns to encoder main body 16Ya.

In encoder main body 16Ya, the reflected light of the first polarized component reflected by grating 24 and the reflected light of the second polarized component reflected by PBS18 is synthesized into an interference light by the optical system (e.g., including the polarizer and the like), and the interference light is received by the photodetector, which detects an interference fringe formed on a photodetection surface of the photodetector. This detection result is sent to the controller (not shown), and the controller computes positional information related to the Y-axis direction of wafer table WTB (wafer W) from the detection result.

Referring back to FIG. 2, the configuration of encoder main body 16Yb is also similar to encoder main body 16Ya. More specifically, although it is not shown, encoder main body 16Yb includes a photodetector, which is configured including a light source that emits a laser beam for measurement, an optical system, a CCD and the like inside. Laser beam Ly2 emitted from encoder main body 16Yb is also is split by polarization into a first polarized component (passing light) and a second polarized component (reflected light) by PBS18 arranged on the +Y edge surface of wafer table WTB. Of the polarized component (the first polarized component) that has passed through PBS18, the light which returns via bottom surface 22a and the grating of grating 24 whose periodic direction is in the Y-axis direction and the light of the polarized component reflected by PBS18 (the second polarized component) return to encoder main body 16Yb. In this case, of laser beam Ly2 emitted from encoder main body 16Yb, the light incident on grating 24 is always incident on point IAa right under the center of exposure area IA on which laser beam Ly1 is incident. Then, an interference light is received with the photodetector in encoder main body 16Yb, and based on the detection result, the controller (not shown) computes positional information related to the Y-axis direction of wafer table WTB (wafer W).

Figure 3B:
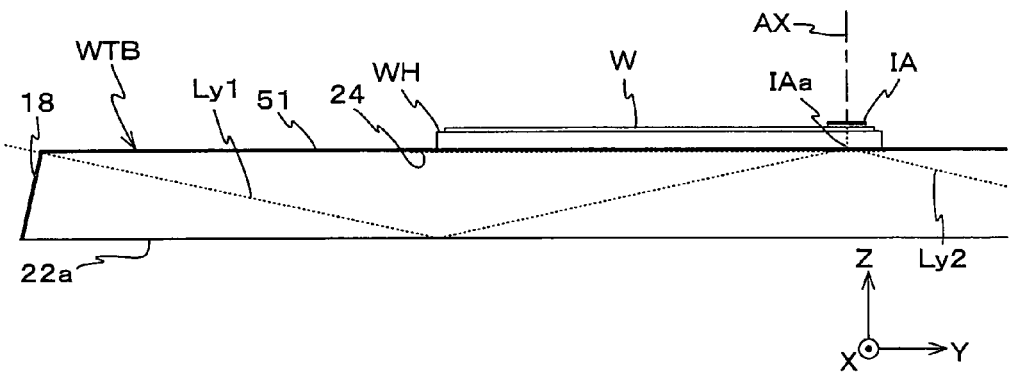
Figure 3C:
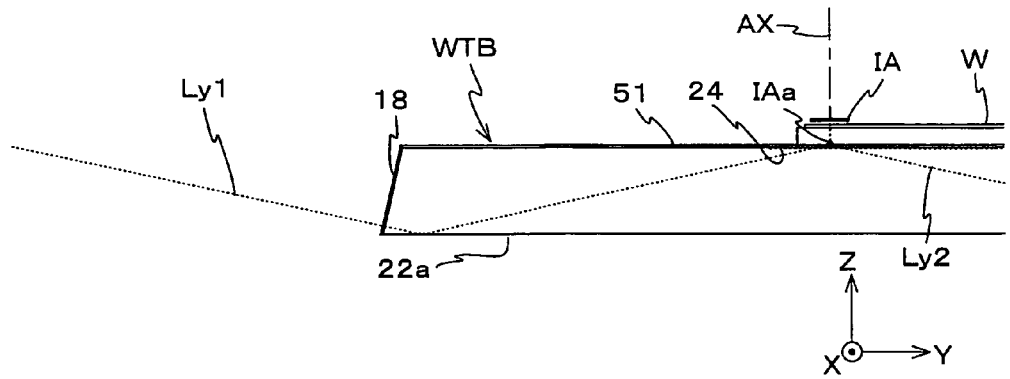

In the embodiment, as shown in FIGS. 3A to 3C, laser beam Ly1 emitted from encoder main body 16Ya and laser beam Ly2 emitted from encoder main body 16Yb respectively enter PBS18, and are incident on the same point IAa right under the center of exposure area IA. Therefore, while wafer table WTB moves in the range shown in FIGS. 3A to 3C in the Y-axis direction which is a measurement direction, the positional information of wafer table WTB in the Y-axis direction can be constantly measured using encoder main bodies 16Ya and 16Yb. Further, while exposure area IA is located at least on wafer W, laser beams Ly1 and Ly2 do not move away from PBS18 even if wafer stage WST moves in the X-axis direction. Therefore, positional information of wafer table WTB in the Y-axis direction can be constantly measured by encoder main bodies 16Ya and 16Yb, at least during the exposure operation.

Accordingly, the controller (not shown) averages measurement results (coordinate values) according to the encoder main bodies (16Ya, 16Yb) which can measure the positional information in the Y-axis direction, and computes the average value as positional information in the Y-axis direction.

Incidentally, also for encoder main bodies 16Xa and 16Xb that perform position measurement related to the X-axis direction, only the points where the measurement direction is in the X-axis direction and with this, the outgoing direction of laser beams Lx1 and Lx2 for measurement (refer to FIG. 2) is parallel to the an XZ plane, and where the grating of grating 24 whose periodic direction is in the X-axis direction are different, and other configurations and measuring methods are similar. Further, while exposure area IA is located at least on wafer W, laser beams Lx1 and Lx2 do not move away from PBS18 even if wafer stage WST moves in the Y-axis direction. Accordingly, at least during the exposure operation, the positional information of wafer table WTB in the X-axis direction can be constantly measured using encoder main bodies 16Xa and 16Xb, respectively. The controller (not shown) averages measurement results (coordinate values) according to the encoder main bodies 16Xa and 16Xb as in the description above, and computes the average value as positional information of wafer table WTB in the X-axis direction.

As described above, according to the embodiment, laser beams Ly1, Ly2, Lx1, and Lx2 emitted from encoder main bodies 16Ya, 16Yb, 16Xa, and 16Xb enter wafer table WTB from the outside, and reach point IAa which is located right under the center of exposure area IA and are diffracted with grating 24. Then, by receiving the interference light of the first polarized component returning from grating 24 and the second polarized component reflected by PBS18 with the photodetector of each encoder main body, positional information of wafer table WTB is measured. Accordingly, until the first polarized component which has passed through PBS18 is synthesized with the second polarized component, or more specifically, until the first polarized component is emitted outside PBS18, the first polarized component passes inside wafer table WTB and does not proceed in the atmosphere outside. Therefore, between PBS18 and grating 24, the first polarized component (measurement beam) is not affected by the fluctuation of the atmosphere around wafer table WTB. Furthermore, outside wafer table WTB, the first polarized component and the second polarized component pass the same optical path. Accordingly, it becomes possible to perform a highly precise position measurement of wafer table WTB.

Further, in the embodiment, because position measurement of wafer table WTB can be performed with high accuracy, it becomes possible for the controller to relatively move reticle R and wafer W with good precision by moving wafer table WTB, based on the measurement result. Accordingly, exposure with high precision can be realized.

Further, in the embodiment, because grating 24 is arranged on the rear surface of wafer holder WH of wafer table WTB, the position of grating 24 on wafer table WTB does not minutely change due to acceleration of wafer table WTB. Therefore, position measurement with high precision can be performed even when wafer table WTB is being accelerated. Accordingly, it becomes possible to start exposure, for example, even during acceleration, and a high throughput can be expected.

Further, in the embodiment, because the position of wafer table WTB is measured at predetermined point IAa directly under the center of exposure area IA, position measurement can be performed with high precision without an Abbe error, and by performing position control of the wafer on exposure using the measurement result, it becomes possible to perform exposure with high precision.

Incidentally, in the embodiment above, for the sake of convenience, a pair of encoder main bodies (encoder main bodies for Y position measurement) which measures positional information in the Y-axis direction and a pair of encoder main bodies (encoder main bodies for X position measurement) which measures positional information in the X-axis direction were arranged, however, the present invention is not limited to this, and for example, in the case of measuring yawing (rotation information in the θz direction) of wafer table WTB, at least one of the encoder main body for Y position measurement and the encoder main body for X position measurement can be arranged in two or more pairs. In this case, the two pairs of encoder main bodies can be placed so that the laser beams for measurement are incident on the grating at positions equally distant with the center of exposed areas IA in between. For example, in the case two pairs of encoder main bodies for Y position measurement is arranged, the irradiation point of the laser beam for measurement from a first pair of encoder main bodies and the irradiation point of the laser beam for measurement from a second pair of encoder main bodies are set at the same position as the center of exposure area IA in the Y-axis direction and also at positions equally distant from the center of exposure area IA in the X-axis direction. In this case, positional information in the θz direction can be obtained from measurement values of at least one of the first pair of encoder main bodies and at least one of the second pair of encoder main bodies. Further, the first pair of encoder main bodies and one of the second pair of encoder main bodies, or one each of the pairs of encoder main bodies can be arranged, and positional information of wafer table WTB in the Y-axis direction and the θz direction can be obtained from the measurement values of these two or three encoder main bodies.

Incidentally, in the embodiment above, the case has been described where the Y position (the X position) of wafer table WTB was decided by averaging the measurement values (coordinate values) of the encoder main bodies for Y position measurement (or the encoder main bodies for X position measurement), however, the present invention is not limited to this, and the Y position (or the X position) can be one of the measurement values of a pair of encoder main bodies. In this case, for example, one of the encoder main bodies can be constantly used and the other encoder main body can be used only when the one main body can no longer perform measurement for some reason, or, for example, the pair of encoder main bodies can be switched hourly. Further, for example, one of the encoder main bodies can be constantly used, and the other encoder can be used for calibration (adjustment) of the one encoder main body.

Further, in the embodiment above, a pair of encoder main bodies for X position measurement and a pair of encoder bodies for Y position measurement whose irradiation point (that is, measurement point of the encoder main body) of the laser beams for measurement is at the same position were arranged, and the average value of the measurement results (coordinate values) of a pair of encoder main bodies whose measurement direction is the same was decided as the positional information of wafer table WTB in the measurement direction. However, the present invention is not limited to this, and the measurement point of a pair of encoder main bodies whose measurement direction is the same can be placed at a different position in a direction besides the measurement direction which is orthogonal to the measurement direction within the XY plane, such as for example, a position symmetric to the center of exposure area IA. In other words, the measurement axes (coinciding with the laser beams for measurement in the embodiment above) of the pair of encoder main bodies whose measurement direction is the same can be placed shifted in a direction orthogonal to the measurement axes in the XY plane. In this case, positional information of wafer table WTB in the measurement direction can be obtained from at least one of the measurement results (coordinate values) of the pair of encoder main bodies, and positional information of wafer table WTB in the $\theta z$ direction can be obtained from both of the measurement results. In the embodiment above, the measurement axes (and an incidence direction of the laser beam for measurement) of the pair of encoder main bodies whose measurement direction is the same, are parallel with the measurement direction. Incidentally, in the pair of encoder main bodies whose measurement direction is the same, the position of the measurement point can be made to differ in both the X-axis and the Y-axis directions. Further, in the embodiment above, the pair of encoder main bodies whose measurement direction is the same was placed on both sides with wafer table WTB in between, however, the encoder main bodies can be arranged on the same side with respect to wafer table WTB. In this case, not only positional information in the measurement direction but also positional information in the $\theta z$ direction can be measured. Furthermore, in the embodiment above, a pair of encoder main bodies for X position measurement and a pair of encoder main bodies for Y position measurement were arranged, however, the number of encoder main bodies is not limited to four, and can be three or less or five or more. For example, only one of an encoder main body for X position measurement and an encoder main body for Y position measurement can be arranged, and the other can be arranged in pairs. In this case, by placing the pair of encoder main bodies on the same side with respect to wafer table WTB, it becomes possible to measure positional information in the X-axis and Y-axis directions and positional information in the $\theta z$ direction. Or, only one encoder main body for X position measurement and/or one encoder main body for Y position measurement can be arranged to measure positional information of wafer table WTB in the X-axis and/or Y-axis direction. Even in this case, measurement by the encoder main body is constantly performed, which makes it possible to realize wafer positioning with high precision.

Figure 4A:
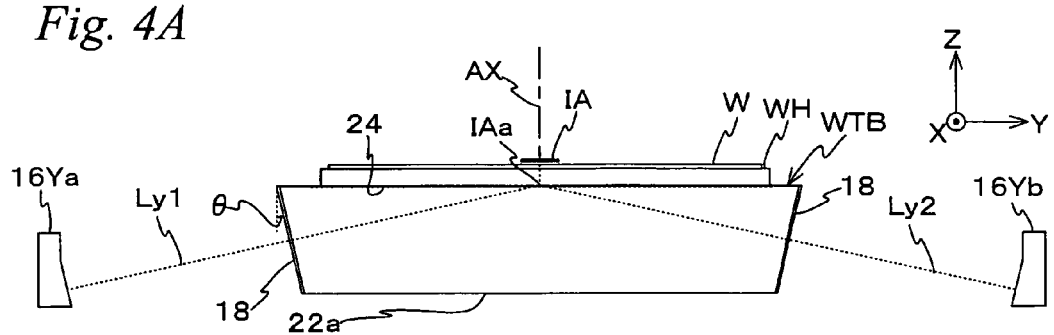
FIGS. 4A to 4C are views to describing a modified example of a wafer table and an encoder related to the first embodiment.

Incidentally, in the embodiment above, the case has been described where the −Y side edge surface and the +Y side edge surface of wafer table WTB were inclined at a predetermined angle ($\theta$) with respect to the XZ plane and the −X side edge surface and the +X side edge surface of wafer table WTB were inclined at a predetermined angle ($\theta$) with respect to the YZ plane, however, the present invention is not limited to this. For example, as shown in FIG. 4A and the like, the −Y side edge surface and the +Y side edge surface of wafer table WTB can be inclined at a predetermined angle ($-\theta$) with respect to the XZ plane and the −X side edge surface and the +X side edge surface of wafer table WTB can be inclined at a predetermined angle ($-\theta$) with respect to the YZ plane. In this case, the Y side edge surface and the X side edge surface both form an obtuse angle ($90°+\theta$) with the bottom surface of wafer table WTB, or more specifically, form an acute angle ($90°-\theta$) with the upper surface (the grating surface on which grating 24 is formed). Further, as shown in FIG. 4A, laser beams Ly1 and Ly2 (and, Lx1 and Lx2) each are incident on the corresponding edge surface perpendicularly. Incidentally, because the configuration of other sections is totally the same as the embodiment above, the description here will be omitted.

Figure 4B:
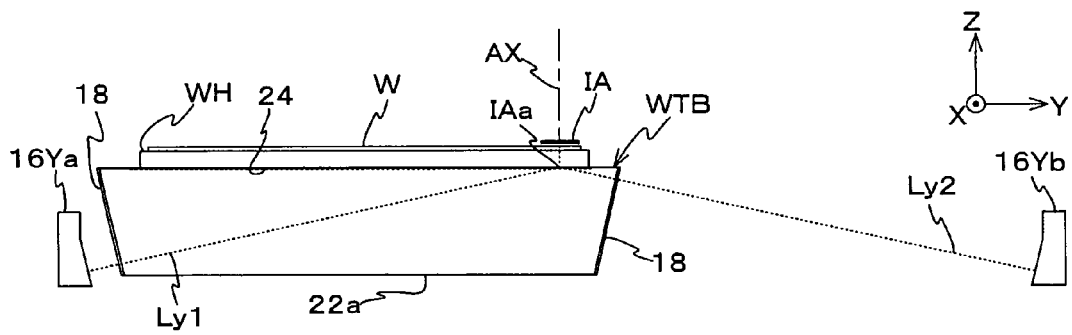
Figure 4C:
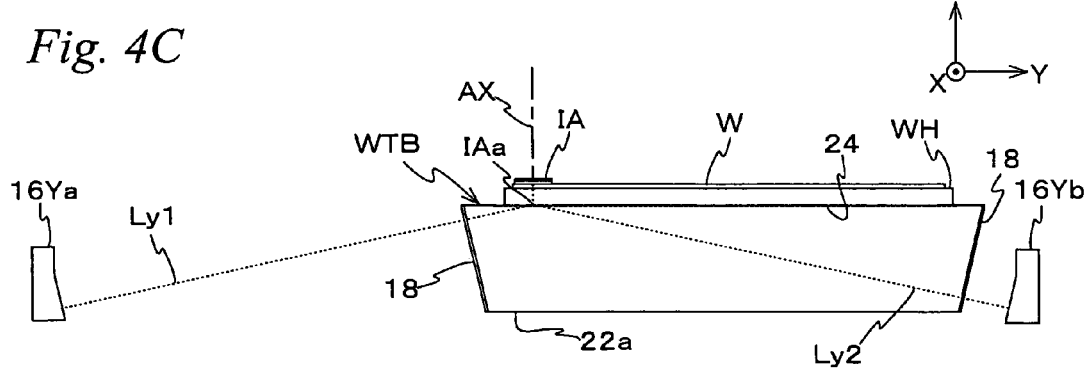

Even if such a configuration is employed, as in the embodiment above, laser beams Ly1 and Ly2 (and, Lx1 and Lx2) for measurement emitted from encoder 16Ya and 16Yb (16Xa and 16Xb) are incident on point IAa right under the center of exposure area IA (refer to FIGS. 4A to 4C). Accordingly, in the case of employing the configuration shown in FIGS. 4A to 4C, it is possible to perform position measurement of wafer table WTB similarly as in the embodiment above. Further, in the case of employing the configuration shown in FIGS. 4A to 4C, because laser beams Ly1 and Ly2 (and, Lx1 and Lx2) for measurement do not have to be reflected by the bottom surface of wafer table WTB, it is possible to reduce the size of wafer table WTB in the Y-axis direction and the X-axis direction, as it can be seen when comparing FIG. 4A and the like and 3A and the like. Further, in the configuration shown in FIGS. 4A to 4C, it is possible to reduce the angle formed between the obliquely incident laser beam for measurement and grating 24 without increasing the size of wafer table WTB in the X-axis and the Y-axis directions. Because of this, compared to the embodiment above, the size (height or thickness) of wafer table WTB in the Z-axis direction can be reduced. Accordingly, in the configuration shown in FIGS. 4A to 4C, the size of wafer table WTB can be greatly reduced when compared with the embodiment above.

A Second Embodiment

Figure 5A:
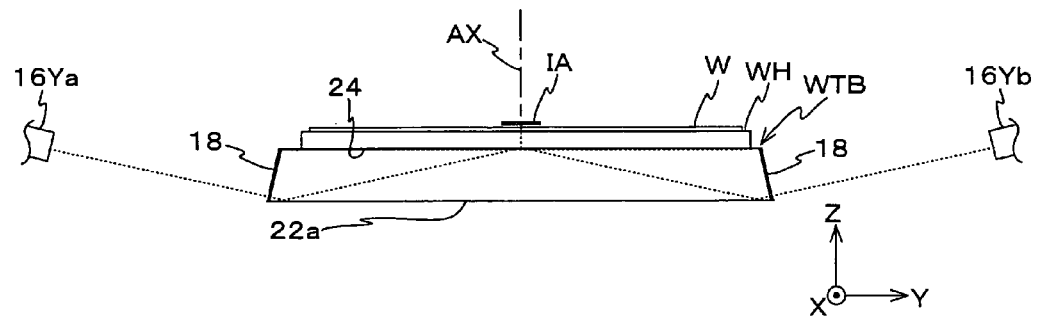
FIGS. 5A to 5C are views for describing a measurement by an encoder main body in a second embodiment.
Figure 5B:
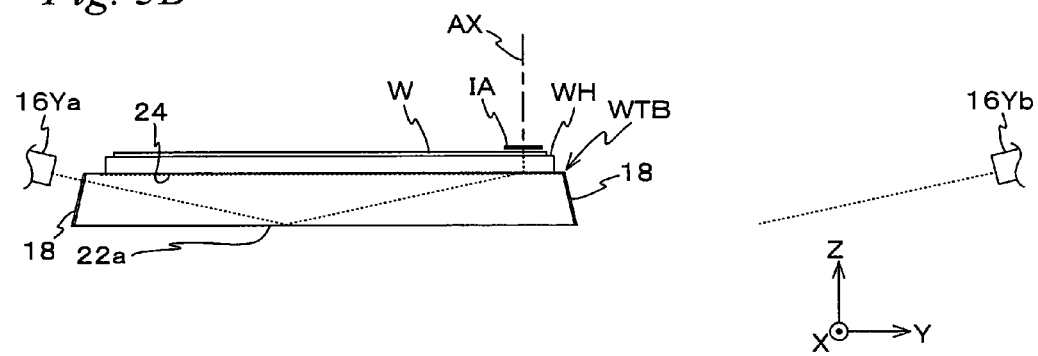
Figure 5C:
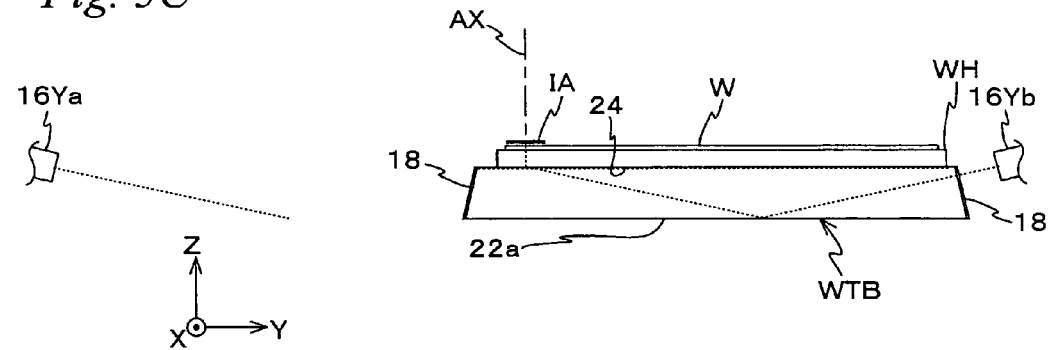

Next, a second embodiment of the present invention will be described, referring to FIGS. 5A to 5C. As shown in FIGS. 5A to 5C, in the second embodiment, the point where a wafer table WTB slightly larger than wafer holder WH is used as wafer table WTB is different from the first embodiment previously described (FIG. 2), however, the other configuration and the like is similar to the first embodiment. Accordingly, the description below will be made focusing on this difference, and in order to avoid redundancy, the same reference numerals will be used for the same or similar sections and a detailed description thereabout will be omitted. Incidentally, the size of wafer table WTB in the second embodiment is almost the same as wafer table WTB shown in FIGS. 4A to 4C.

In the second embodiment as well, encoder main bodies 16Ya, 16Yb, 16Xa, and 16Xb are placed on the ±Y side and the ±X side of wafer table WTB. In this case, when wafer table WTB is positioned as shown in FIG. 5A at a position where the center of wafer W substantially coincides with the center of exposure area IA, positional relation of encoder main bodies 16Ya and 16Yb are set so that the laser beams emitted from encoder main bodies 16Ya and 16Yb are incident on a lower end section of a pair of PBS18 arranged on the −Y side edge surface and the +Y side edge surface of wafer table WTB, respectively. Although there is a difference of the Y-axis direction and the X-axis direction, the positional relation between encoder main bodies 16Xa and 16Xb is set similar to encoder main bodies 16Ya and 16Yb.

Therefore, when wafer table WTB moves to the −Y side or the +Y side than in FIG. 5A as shown in FIGS. 5B and 5C, respectively, light from one of the encoder main bodies 16Ya and 16Yb (encoder main body 16Yb in the case of FIG. 5B, and encoder main body 16Ya in the case of FIG. 5C) will not be incident on PBS18. Accordingly, in the embodiment, switching of encoder main bodies 16Ya and 16Yb used for measurement of positional information in the Y-axis direction is performed. More specifically, measurement of the positional information by one of the encoder main bodies 16Ya and 16Yb can be switched to measurement of positional information by the other encoder main body.

Therefore, in the second embodiment, before the laser beam from one of encoder main bodies 16Ya and 16Yb moves off from PBS18, that is, when wafer table WTB is located at a position where the laser beams from encoder main bodies 16Ya and 16Yb can be simultaneously incident on a pair of PBS18 arranged on the −Y side edge surface and the +Y side edge surface of wafer table WTB, such as, for example, when wafer table WTB is at the position shown in FIG. 5A, a controller (not shown) performs linkage of measurement values of one of the encoder main bodies and measurement values of the other encoder main body. More specifically, the controller gives an initial value of a measurement value of the other encoder main body so that a measurement result of the other encoder main body matches with a measurement result of the one encoder main body. This linkage process should be performed from the point where the laser beam of the other encoder main body which has moved away from PBS18 is incident on PBS18 again until the laser beam from the one encoder main body moves away from PBS18 (or until position measurement by the one encoder main body is switched to position measurement by the other encoder main body). Further, the linkage process does not have to be performed simultaneously with the switching of the encoder main body used for position measurement, and the linkage process can be performed before the switching. Furthermore, the linkage process and the switching of the encoder main body are each performed according to the position of wafer table WTB in the Y-axis direction, or in other words, the execution timing is decided according to the position of wafer table WTB in the Y-axis direction.

Further, the controller performs a similar process also for encoder main body 16Xa and 16Xb for X position measurement. More specifically, the controller gives an initial value of a measurement value as is described above before the laser beam from one of the encoder main body is no longer incident on PBS18.

In the manner described above, the controller can constantly measure positional information of wafer table WTB in the Y-axis direction with at least one of encoder main bodies 16Ya and 16Yb, and can also constantly measure positional information of wafer table WTB in the X-axis direction with at least encoder main bodies 16Xa and 16Xb. Accordingly, the size of wafer table WTB can be reduced without any serious problems.

As described above, according to the second embodiment, besides being able to obtain an operation effect that is equal to the first embodiment previously described, since the controller performs linkage of measurement values between encoder main bodies, position control of wafer table WTB can be performed without any problems in particular even when the size of wafer table WTB is reduced. Accordingly, the weight of wafer table WTB can be reduced, which makes improvement of the position controllability including the accuracy of positioning of wafer table WTB possible, which in turn makes exposure with high precision possible. Further, when the weight of wafer table WTB is reduced, high acceleration can also be realized, which leads to an expectation in an improvement in the throughput of the exposure apparatus.

Incidentally, also in the second embodiment described above, for the sake of convenience, a pair of encoder main bodies for Y position measurement and a pair of encoder main bodies for X position measurement whose measurement points were set at the same position were arranged, however, the present invention is not limited to this, and in the case of measuring yawing of wafer table WTB (θz rotation), at least two pairs or more of one of the encoder main bodies for Y positional measurement and X positional measurement can be arranged. In this case, the two pairs of encoder main bodies can be arranged so that the lights emitted from each of the encoder main bodies are incident on positions of an equal distance with the center of exposure area IA in between.

Further, also in the second embodiment above, the −Y side edge surface and the +Y side edge surface of wafer table WTB can be inclined at a predetermined angle (−θ) with respect to the XZ plane and the −X side edge surface and the +X side edge surface of wafer table WTB can be inclined at a predetermined angle (−θ) with respect to the YZ plane, as shown in FIG. 4A and the like. In this case, the size of wafer table WTB can be further reduced, and the range in which position measurement by the encoder can be performed can be expanded. As well as the descriptions above, also in the second embodiment, a configuration similar to other modified examples in the first embodiment previously described can be applied.

A Third Embodiment

Next, a third embodiment of the present invention will be described, referring to FIGS. 6A to 6C. The third embodiment is different on the points where the laser beam is incident on wafer table WTB from the upper surface side, and along with this, PBS18 is not arranged on the edge surface of wafer table WTB, from the first and second embodiments in which the laser beams for measurement were incident on wafer table WTB from the side surface, however, the configuration and the like of other sections are similar to the first embodiment previously described. In the description below, the different points will be mainly described, and as for the configuration or the like of the same or similar sections, the same reference numerals will be used and a detailed description thereabout will be omitted.

Figure 6A:
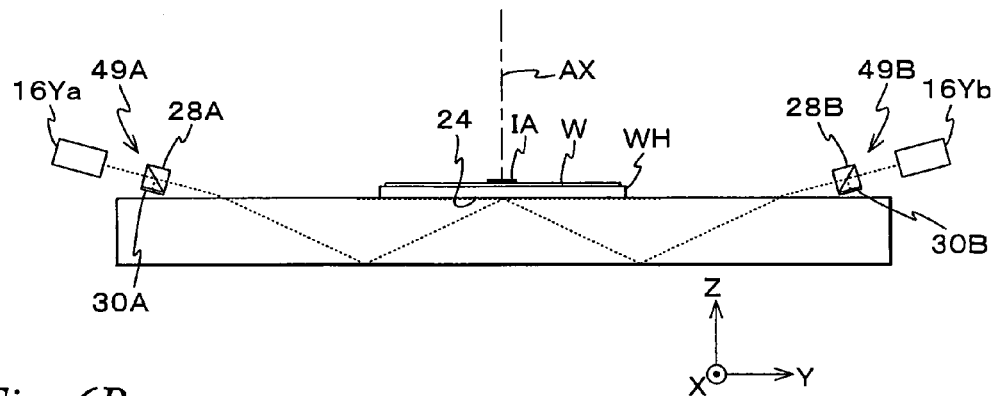
FIGS. 6A to 6C are views for describing a measurement by an encoder main body in a third embodiment.

In the third embodiment, in order to make a laser beam for measurement be incident from the upper surface of wafer table WTB, a pair of polarization separation/composite members 49A and 49B is placed above wafer table WTB in symmetry to an optical axis AX, as shown FIG. 6A.

Polarization separation/composite members 49A and 49B are fixed above wafer table WTB in the vicinity of each of the encoder main bodies 16Ya and 16Yb, by a support member (not shown). Polarization separation/composite member 49A includes a cube type polarization beam splitter 28A, and a reflecting mirror 30AB fixed to the surface of polarization beam splitter 28A positioned on the lowest side (the −Z side). Similarly, polarization separation/composite member 49B includes a polarization beam splitter 28B and a reflecting mirror 30B, and is configured in the same manner as polarization separation/composite member 49A.

In polarization separation/composite members 49A and 49B, the entering laser beams from encoder main bodies 16Ya and 16Yb are each separated into a polarized component which passes through polarization beam splitters 28A and 28B (for example, to be referred to as a first polarized component), and a polarized component which is reflected (for example, to be referred to as a second polarized component) by the polarization beam splitters. Then, the reflected polarized components (the second polarized components) are reflected by reflecting mirrors 30A and 30B, and are reflected by beam splitters 28A and 28B again, and then return to encoder main bodies 16Ya and 16Yb. More specifically, polarization separation/composite members 49A and 49B perform a function similar to PBS18 that was previously described in the first and second embodiments. Accordingly, also in the third embodiment, position measurement can be performed similar to the first and second embodiments described above.

Figure 6B:
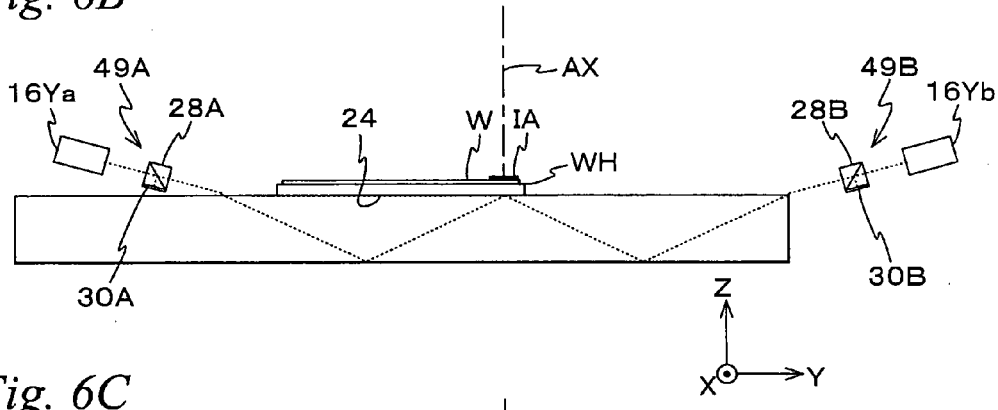
Figure 6C:
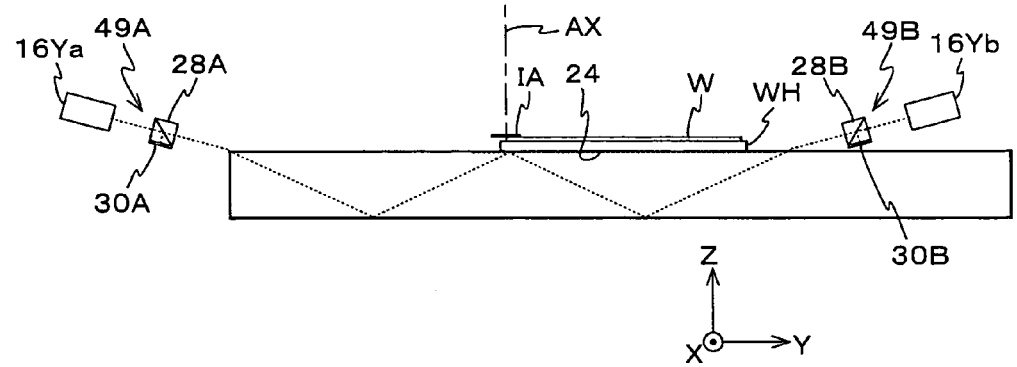

Further, in the third embodiment, because one side of wafer table WTB is around three times the diameter of wafer W as in the first embodiment as shown in FIG. 6A, even if wafer table WTB moves within a range between the position shown in FIG. 6B and the position shown in FIG. 6C, laser beams for measurement from encoder main bodies 16Ya and 16Yb are made to be constantly incident on wafer table WTB. Accordingly, positional information of wafer table WTB in the Y-axis direction can constantly be measured, using the two encoder main bodies 16Ya and 16Yb. Therefore, in a controller (not shown), the Y position of wafer table WTB can be computed with high precision, based on an average value of these measurement results (coordinate values).

Incidentally, although it is omitted in the drawings, on the +X side of exposure area IA, an encoder main body 16Xa is arranged as in the first and second embodiments described above, and an encoder main body 16Xb is arranged on the −X side. Further, also in the vicinity of encoder main bodies 16Xa and 16Xb, polarization separation/composite members similar to polarization separation/composite members 49A and 49B described above are arranged, and position measurement in the X-axis direction is performed in a manner similar to the position measurement in the Y-axis direction. Accordingly, a highly precise measurement can be performed also for the position of wafer table WTB in the X-axis direction.

As described above, according to the third embodiment, position measurement of wafer table WTB can be performed with high precision as in the first embodiment, therefore, by driving wafer table WTB based on the measurement results, positioning with high precision can be performed, which makes it possible to perform exposure with high precision.

Incidentally, in the third embodiment above, the case has been described where one side of wafer table WTB was set to around three times the diameter of wafer W as in the first embodiment, however, the present invention is not limited to this, and wafer table WTB can be set to a size slightly larger than wafer W, as in the second embodiment. In this case, as in the second embodiment described above, by performing a linkage of measurement by the two encoder main bodies for the X-axis and Y-axis directions (for example, giving an initial value of a measurement value of the other encoder main body so that a measurement result of one encoder main body matches a measurement result of the other encoder main body), the position of wafer table WTB can be constantly measured. With the arrangement above, the size and weight of wafer table WTB can be reduced without any problems, therefore, also from this point, a highly precise positioning of wafer table WTB can be achieved.

Incidentally, in the third embodiment above, for example, in the case of measuring yawing (the θz rotation) of wafer table WTB as in the first and second embodiments, at least one of the encoder main body for X position measurement and the encoder main body for Y position measurement can be arranged in two or more pairs. Further, in the third embodiment, a configuration similar to each of the modified examples described earlier in the first embodiment can also be applied.

A Fourth Embodiment

Next, a fourth embodiment of the present invention will be described, referring to FIG. 7.

Figure 7:
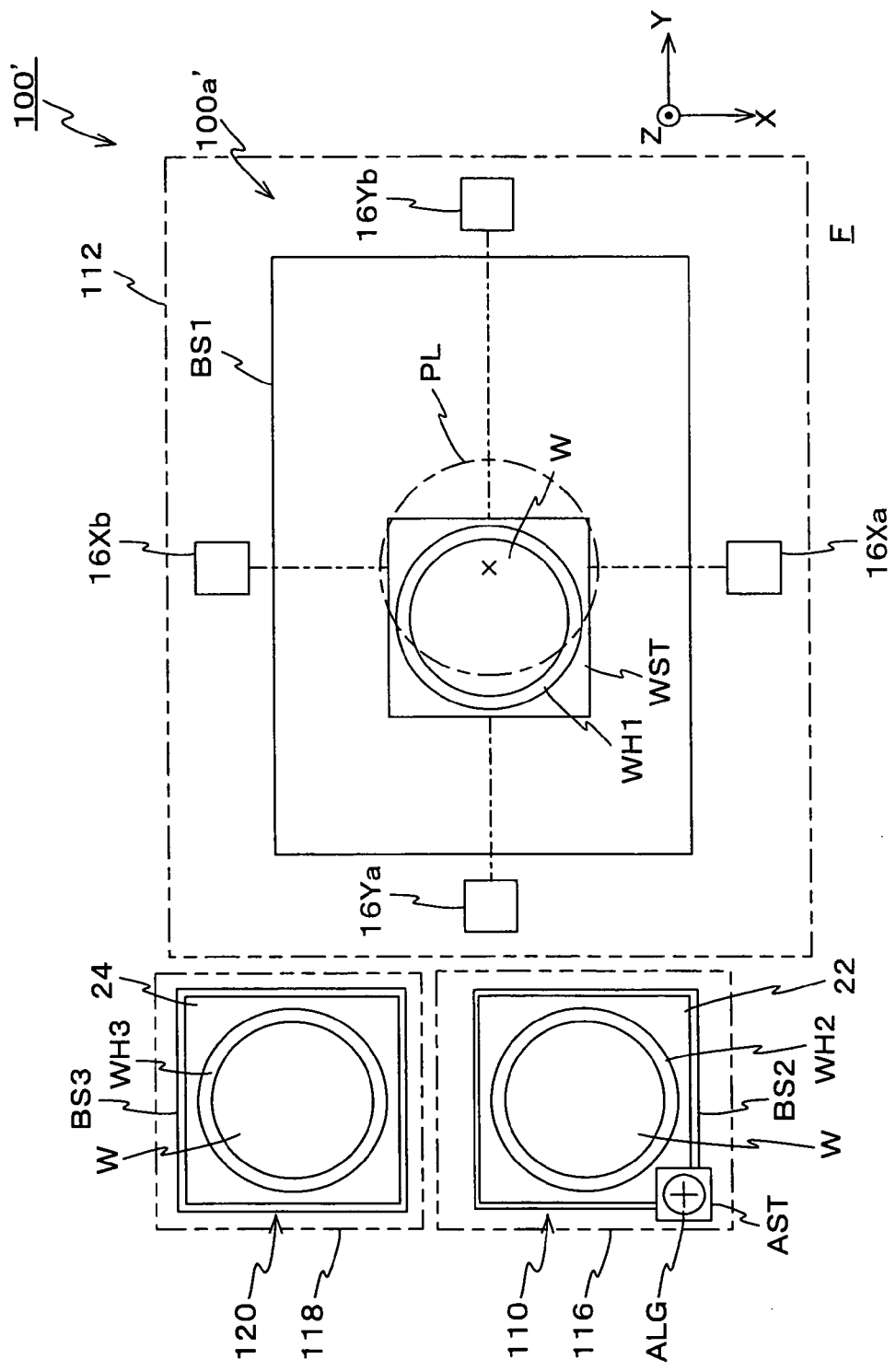
FIG. 7 is a planar view that shows an exposure apparatus partially omitted related to a fourth embodiment.

FIG. 7 shows a planar view of an exposure apparatus 100' related to the fourth embodiment whose arrangement is partially omitted.

Exposure apparatus 100' includes a main body chamber 112, an exposure apparatus main section 100*a*' including wafer stage WST arranged in main body chamber 112, an alignment chamber 116 arranged in the vicinity of main body chamber 112, a measurement section 110 housed in alignment chamber 116, a wafer exchange chamber 118 arranged on the −X side of alignment chamber 116, and a wafer exchange section 120 arranged within wafer exchange chamber 118.

In the inside of main body chamber 112, environmental conditions (such as degree of cleanliness, temperature, pressure force and the like) are maintained substantially constant.

Exposure apparatus main section 100*a*' has a configuration which is substantially the same as the first embodiment (exposure apparatus 100 in the first embodiment) previously described, and wafer stage WST is supported by levitation via a predetermined clearance with respect to a base BS1 arranged on a floor surface F by a magnetic levitation mechanism (or an air bearing) (not shown).

On wafer stage WST configuring exposure apparatus main section 100*a*', a wafer holder WH1 is mounted. On the lower surface of wafer holder WH1, a two-dimensional grating (not shown) is arranged. Further, in the vicinity of the grating, a mark for deciding the origin of the grating (hereinafter referred to as an "origin mark") is arranged. This origin mark is detectable by encoder main bodies 16Ya, 16Yb, 16Xa, and 16Xb in a state where wafer holder WH1 is mounted on wafer stage WST, and further, is also detectable by an alignment system ALG which will be described later on.

Further, as in the second embodiment, for example, wafer table WTB is configured of a transparent plate-shaped member such as glass or the like and the side surface on the +Y side and the −Y side extend in the X-axis direction as well as slant to an XZ plane, and the side surface on the +X side and the −X side extend in the Y-axis direction as well as sling to a YZ plane, and on these side surfaces, a PBS (not shown) is arranged. Incidentally, unlike the second embodiment, the grating is not installed on the upper surface of wafer table WTB, however, a grating is installed on the rear surface of wafer holder WH1. By using this grating, the position of wafer holder WH1 in the XY plane can be measured as in each of the embodiments above with encoder main bodies 16Ya, 16Yb, 16Xa, and 16Xb. Incidentally, the rear surface of wafer holder WH1 can be covered with a protective member (e.g., a cover glass, a film or the like).

Incidentally, instead of wafer holder WH1, wafer table WTB can also hold wafer holders WH2 and WH3 in FIG. 7. In the embodiment, by using gratings installed on the rear surfaces of wafer holders WH2 and WH3 held by wafer table WTB, the position of wafer holders WH2 and WH3 in the XY plane can be measured by encoder main bodies 16Ya, 16Yb, 16Xa, and 16Xb.

In the inside of alignment chamber 116, environmental conditions (such as degree of cleanliness, temperature, pressure force and the like) are maintained substantially constant separately with main body chamber 112 previously described.

Measurement section 110 includes a base BS2 arranged on floor surface F independent from base BS1, a first holder holding member 22 arranged on base BS2, an alignment system ALG, and an alignment stage AST for driving alignment systme ALG two-dimensionally on base BS2. Incidentally, although it is not shown, for example, base BS2 is placed on floor surface F (or on a base plate) via four viibration isolation units.

The first holder holding member 22 has a rough square shape in a planar view, and in FIG. 7, supports wafer holder WH2, which can hold wafer W, on its upper surface. This wafer holder WH2 has a configuration similar to wafer holder WH1 previously described, and has a two-dimensional grating arranged on the rear surface. Incidentally, instead of wafer holder WH2, the first holder hold member 22 can also support wafer holders WH1 and WH3 in FIG. 7.

Although it is omitted in FIG. 7, alignment stage AST holds alignment system ALG, and can be moved two-dimensionally above the first holder holding member 22, for example, by an X linear motor for drive in the X-axis direction and a Y-axis linear motor for drive in the Y-axis direction. This allows a detection area of alignment system ALG to be moved on the wafer, and a plurality of alignment marks can be detected on the wafer.

As alignment system ALG, an alignment system is employed, for example, which includes an optical system, an illumination system including a light source connected to the optical system, and a photodetection system including a CCD. Incidentally, as for the illumination system of alignment system ALG, it does not have to be moved by alignment stage AST and can be arranged external to alignment stage AST, connected by an optical fiber or the like. Incidentally, the arrangement is not limited to this, and a relay optical system including a mirror and the like which transmits a beam from a light source arranged outside to an optical system of alignment system ALG can also be used. Incidentally, alignment system ALG is not limited to a sensor by the image processing method, and other sensors of various methods can also be used. Further, it is desirable that the cables and the like connected to alignment stage AST and alignment system ALG do not interfere with the movement of alignment stage AST.

Position of alignment system ALG in the XY plane is measured using a measurement unit (e.g. an interferometer or an encoder), and the controller (not shown) computes the position of the alignment marks arranged on the wafer, based on the position of alignment system ALG measured by the measurement unit and detection results by alignment system ALG. Further, alignment system ALG detects the origin mark arranged on wafer holder WH2 (or wafer holders WH1 and WH3), and the controller (not shown) computes the positional relation between the origin mark and the alignment marks.

In the inside of wafer chamber 118, environmental conditions (such as degree of cleanliness, temperature, pressure force and the like) are maintained substantially constant separately with main body chamber 112 and alignment chamber 116 previously described.

Wafer exchange unit 120 includes a base BS3 arranged on floor surface F in wafer exchange chamber 118 independent from base BS1 and base BS2 previously described, and a second holder holding member 24 arranged on base BS3. In FIG. 7, wafer W is held via wafer holder WH3 on second holder holding member 24. Wafer holder WH3 has a configuration similar to wafer holders WH1 and WH2 previously described, and has a two-dimensional grating arranged on the rear surface. Incidentally, instead of wafer holder WH3, wafer holders WH1 and WH2 of FIG. 7 can also be mounted on second holder hold member 24.

Furthermore, in the embodiment, a holder carrier unit (not shown) that carries wafer holders WH1 to WH3 between wafer stage WST, the first holder holding member 22, and the second holder holding member 24 is arranged.

In exposure apparatus 100' of the embodiment that has the configuration described above, the following operation is performed. Incidentally, the operation described below is performed by the controller (not shown), however, to avoid complication in the description, details related to the controller will be omitted.

First of all, loading (in the case a wafer that has undergone exposure is held, exchange to a new wafer) of a wafer to wafer holder WH3 held by the second holder holding member 24 of wafer exchange unit 120 is performed.

Then, wafer holder WH3 which holds wafer W is carried from wafer exchange unit 120 by the holder carrier unit (not shown), and wafer holder WH1 on wafer stage WST is carried to wafer exchange unit 120 and is held by second holder holding member 24. And then, wafer holder WH2 on the first holder holding member 22 is carried onto wafer stage WST1, and wafer holder WH3 carried from wafer exchange unit 120 is carried onto the first holder holding member 22. Hereinafter, such carriage operation of the wafer holders will be referred to as a holder circulation operation.

Next, in measurement section 110, alignment of the wafer held by wafer holder WH3 on the first holder holding member 22 is performed. In this alignment, alignment system ALG is driven two-dimensionally by alignment stage AST, and the alignment marks (e.g., eight) formed on the wafer are detected. Further, detection of the origin mark arranged on wafer holder WH3 is also performed, and the positional relation between the origin mark and the alignment marks is also computed.

Meanwhile, in wafer exchange unit 120, in parallel with the alignment operation described above, wafer W is loaded on wafer holder WH1 mounted on the second holder holding member 24.

Then, the holder circulation operation previously described is performed, and wafer holder WH3 is mounted on wafer table WTB, wafer holder WH1 is mounted on the first holder holding member 22, and wafer holder WH2 is mounted on the second holder holding member 24.

Then, in exposure apparatus main section 100a', the origin mark of wafer holder WH3 mounted on wafer table WTB is detected by encoder main bodies 16Ya, 16Yb, 16Xa, and 16Xb, and from the detection result and the positional relation between the alignment marks and the origin mark of wafer holder WH3 measured using alignment system ALG, coordinate values of the alignment marks in an exposure coordinate system are calculated. And then, using the coordinate values of the alignment marks which have been calculated, EGA (Enhanced Global Alignment) as in the one disclosed in, for example, U.S. Pat. No. 4,780,617 description and the like is performed, and based on the results of the EGA, exposure operation of a plurality of shot areas on wafer W is performed.

Further, in parallel with the exposure operation in exposure apparatus main section 100a', in measurement section 110, an alignment operation to wafer W on wafer holder WH1 is performed in the same manner as in the previous description, and in wafer exchange unit 120, loading (in this case, wafer exchange) of a wafer to wafer holder WH2 is performed.

Hereinafter, the wafer circulation operation and each of the operations performed in exposure apparatus main section 100a', measurement section 110, and wafer exchange unit 120 are repeatedly performed, and exposure operation to a predetermined number of wafers is performed.

As discussed above, according to the fourth embodiment, wafer holders WH1 to WH3 are freely detachable with respect to wafer table WTB, and because the origin (origin mark) is arranged on wafer holders WH1 to WH3, even if alignment operation of wafer W is performed in a state where wafer holders WH1 to WH3 are detached from wafer table WTB and then are mounted on wafer table WTB, the alignment result can be used with the origin (origin mark) serving as a reference, therefore, an alignment operation can be performed on one wafer and an exposure operation can be performed on the other wafer in parallel. Accordingly, high throughput can be achieved.

Further, also in the embodiment, because position measurement of wafer table WTB is performed using encoder main bodies 16Ya, 16Yb, 16Xa, and 16Xb similar to the first to third embodiments, positioning of wafer table WTB with high precision can be achieved, which in turn makes it possible to perform exposure with high precision.

Incidentally, in the fourth embodiment above, the case has been described where exposure apparatus 100' is equipped with exposure apparatus main section 100a' measurement section 110, and wafer exchange unit 120, however, the present invention is not limited to this, and exposure apparatus 100' can be equipped with only exposure apparatus main section 100a' and measurement section 110. Further, as well as these configurations, in the case the wafer holder is freely detachable to wafer table WTB and alignment on the wafer on the wafer holder is to be performed without using wafer table WTB, the configuration in the fourth embodiment described above in which a grating is arranged on the rear surface of the wafer holder is suitable.

Incidentally, in the fourth embodiment above, the case has been described where alignment of a fixed wafer is performed using a movable alignment system ALG, however, the present invention is not limited to this, and a configuration in which alignment system ALG is fixed and the first holder holding member 22 holding the wafer holder on which the wafer is mounted is movable within the XY plane can be employed.

Incidentally, in the fourth embodiment above, the case has been described where the exposure apparatus main section, the measurement section, and the wafer exchange section are placed in separate chambers, however, the present invention is not limited to this, and each section can all be placed in one chamber, or two of the sections described above can be placed in the same chamber.

Incidentally, in the fourth embodiment above, the encoder system and the wafer table of the second embodiment are employed, however, the encoder system and the wafer table of the first or third embodiment can also be employed. Further, in the fourth embodiment above, in the case of measuring the Az rotation of wafer table WTB, at least one of the encoder main bodies for X-axis measurement and Y-axis measurement can be changed from one pair to two pairs. Further, in the fourth embodiment above, a configuration similar to the configuration in each of the modified examples in the first to third embodiments above can also be applied.

A Fifth Embodiment

Figure 8:
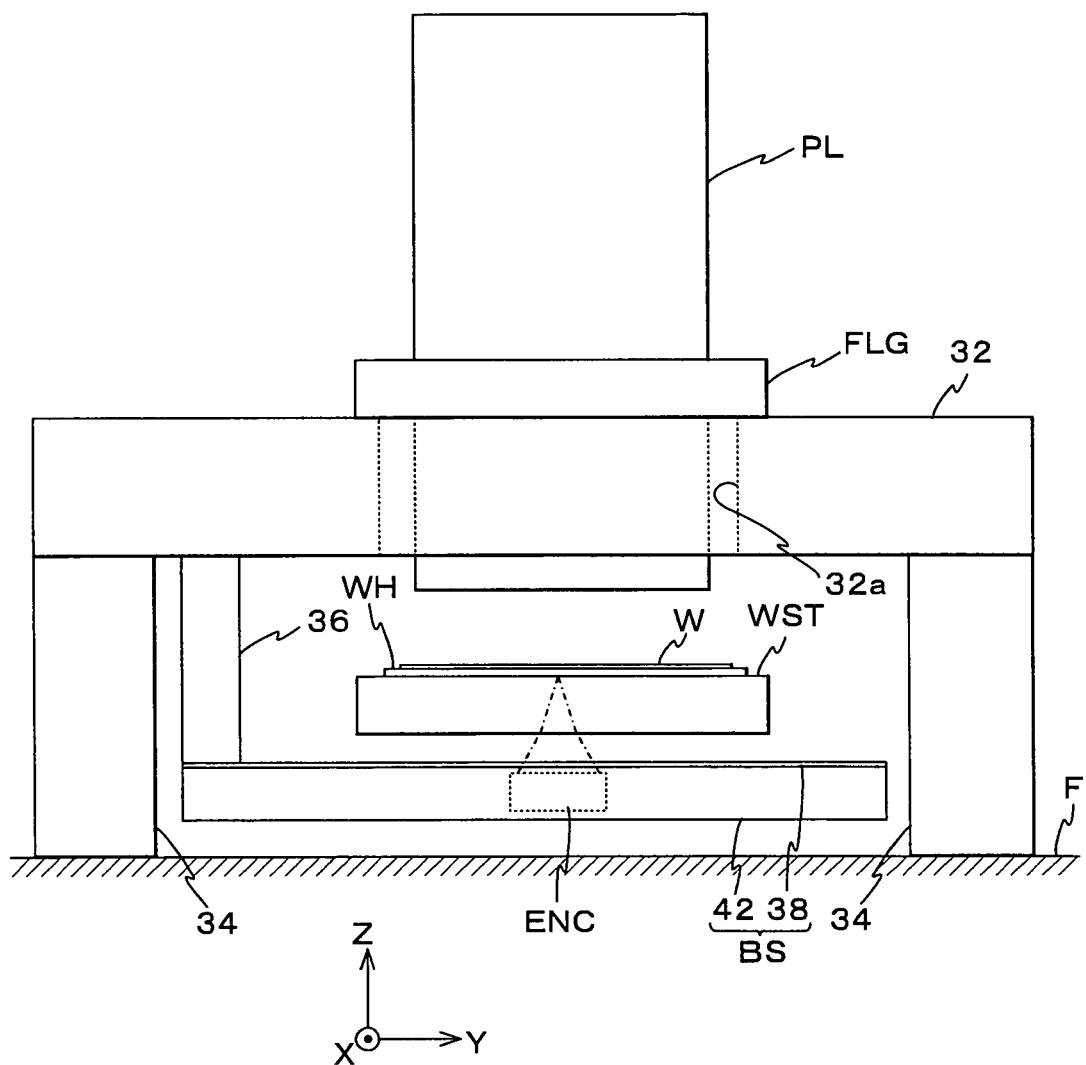
FIG. 8 is a front view that shows a part of an exposure apparatus related to a fifth embodiment.

Next, a fifth embodiment of the present invention will be described, referring to FIGS. 8 and 9. FIG. 8 shows a projection optical system PL of the exposure apparatus related to the fifth embodiment, and the components below the projection optical system. Incidentally, the components above projection optical system PL are similar to the first embodiment shown in FIG. 1, therefore, the drawing and description thereabout will be omitted. Further, projection optical system PL shown in FIG. 8 and the configuration below the projection optical system can be employed without any changes in exposure apparatus 100 in FIG. 1.

In the fifth embodiment, projection optical system PL is supported by a projection optical system base platform (barrel platform (hereinafter referred to as base platform)) 32, which is supported by a plurality of (e.g., three) supporting columns 34 on a floor surface F. The lower end of projection optical system PL is inserted in a circular opening 32a which is formed in the center of base platform 32, and projection optical system PL is supported by base platform 32 via a flange FLG which is arranged slightly below the center in the height direction. Incidentally, as disclosed in, for example, the pamphlet of International Publication No. 2006/038952, projection optical system PL (and base platform 32) can be supported in a suspended state with respect to a base member and the like on which a reticle stage is placed.

On the lower surface of base platform 32, a wafer stage base platform BS is supported by suspension via a suspension support member 36. Incidentally, wafer stage base platform BS can be supported using a plurality of support members 36, without being supported by one suspension support member 36 as in FIG. 8.

Above wafer stage base platform BS, wafer stage WST is movably supported, for example, by magnetic force, by levitation in a non-contact manner. Wafer stage base platform BS includes a thick plate-shaped base platform main body 42, and a cover member 38 consisting of a glass plate or the like arranged on the upper surface of base platform main body 42. Further, on the upper surface of base platform main body 42, a recessed section is formed (not shown), and in the recessed section, an encoder main body ENC for Y position measurement and an encoder main body for X position measurement are arranged. However, the encoder main body for X position measurement is omitted in the drawing.

In wafer stage WST, a configuration different from the first to fourth embodiments is employed. More specifically, wafer stage WST is not made up of a wafer table and a stage main section, and is formed as an integral object, for example, by a rectangular solid shaped glass member. As an example, wafer stage WST is made of the same material as the transmission member of wafer table WTB previously described. Although it is not shown, this wafer stage WST is driven freely (including rotation in the θz direction) in the XY plane, for example, by a wafer stage drive system including a linear motor or a planar motor.

Further, on the upper surface of wafer stage WST, a two-dimensional grating 24 is installed (refer to FIG. 9) similar to wafer table WTB in the first to third embodiments, and its upper surface is covered with a cover glass. Incidentally, grating 24 can be arranged on the lower surface of wafer holder WH, as in the fourth embodiment.

Figure 9:
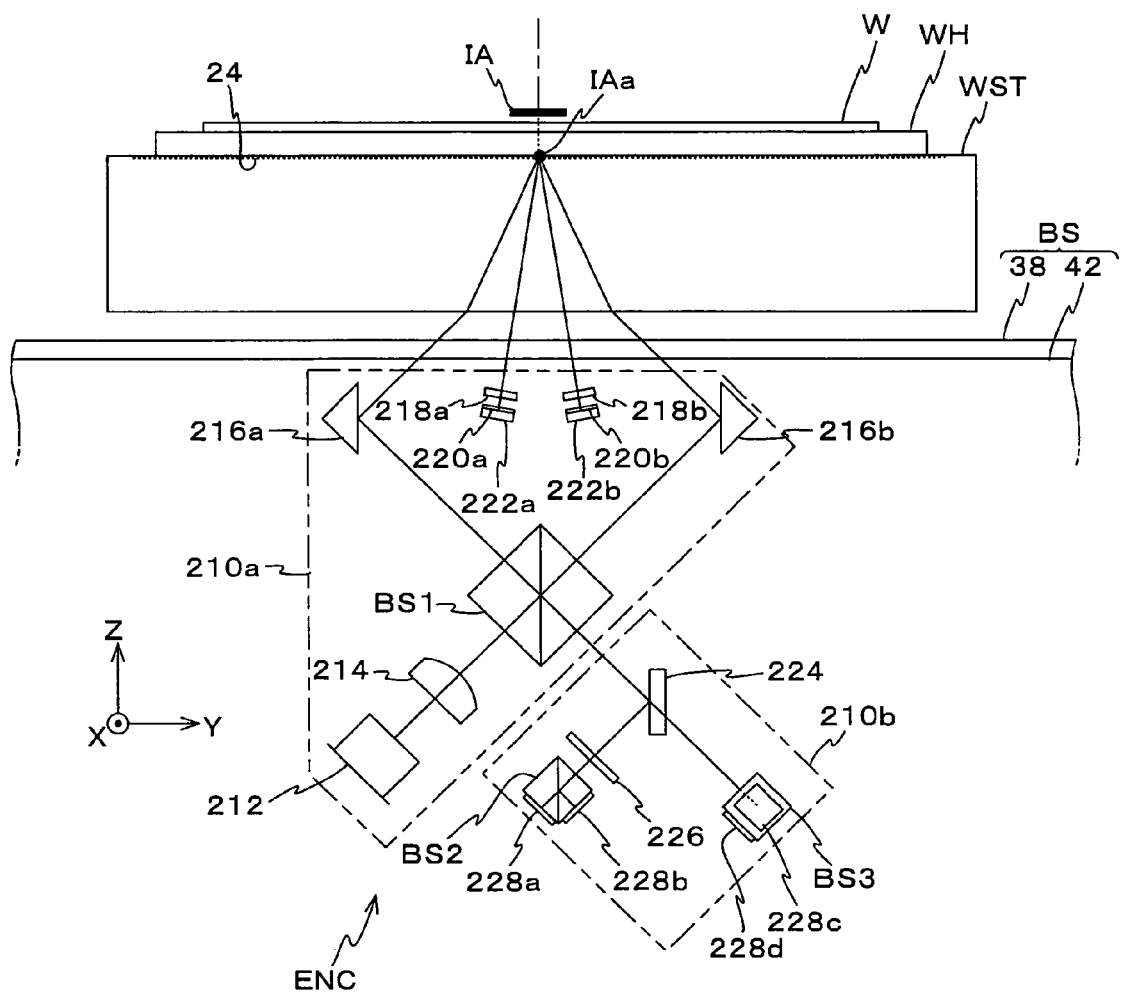
FIG. 9 is a view that shows a configuration of a wafer stage and an encoder main body which performs position measurement of the wafer stage in FIG. 8.

FIG. 9 shows Encoder main body ENC, along with wafer stage WST. In the embodiment, the encoder main body is placed below wafer stage WST, and a laser beam for measurement is made to enter the inside of wafer stage WST from its lower surface so that the beam is irradiated on grating 24. The irradiation point (that is, the measurement point of the encoder main body) of the laser beam for measurement coincides with point IAa, which is right under the center of exposure area IA.

Encoder main body ENC includes a light irradiation section 210a and a light-receiving section 210b. Light irradiation section 210a includes a semiconductor laser 212, a lens 214, a polarization beam splitter BS1, a pair of reflecting mirrors 216a and 216b, a pair of lenses 218a and 218b, a pair of λ/4 plates 220a and 220b, and a pair of planar mirrors 222a and 222b. Further, light-receiving section 210b includes a semitransmissive mirror (a half mirror) 224, a pair of polarization beam splitters BS2 and BS3, a λ/4 plate 226, and four photodetectors 228a, 228b, 228c, and 228d.

In the embodiment, in encoder main body ENC, a laser beam emitted from semiconductor laser 212 is incident on polarization beam splitter BS1 via lens 214, and is split by polarization (separated to an s-polarized light component and a p-polarized light component) by polarization beam splitter BS1 into two laser beams. And, one of the laser beams (the polarized component reflected by polarization beam splitter BS1) is reflected off reflecting mirror 216a, and then is incident on wafer stage WST and reaches grating 24 on the upper surface of wafer stage WST. The irradiation point of the laser beam is to be point IAa right under the center of exposure area IA. Meanwhile, the other laser beam (the polarized component which has passed through polarization beam splitter BS1) is reflected by reflecting mirror 216b, and is incident on wafer stage WST and reaches grating 24 on the upper surface of wafer stage WST. The irradiation point of this laser beam is also point IAa. Then, the light (a diffraction light whose order is a first order or a higher order of the same reference numeral) diffracted with the grating of grating 24 whose periodic direction is the Y-axis direction is reflected off each of the planar mirrors 222a and 222b, via lenses 218a and 218b and λ/4 plates 220a and 220b. And then, by tracing the same optical path as when entering in the reversed direction, each of the reflected lights are incident on polarization beam splitter BS1, after passing through λ/4 plates 220a and 220b again.

In this case, because the lights which have reached polarization beam splitter BS1 each pass λ/4 plates 220a and 220b twice, the polarization direction is rotated by 90° from the entering point of time. Accordingly, one of the lights (that is, the polarized component reflected by polarization beam splitter BS1) via reflecting mirror 216a passes through polarization beam splitter BS1, and the other light (the polarized component which has passed through polarization beam splitter BS1) via reflecting mirror 216b is reflected by polarization beam splitter BS1. More specifically, these light are synthesized coaxially at polarization beam splitter BS1, and then heads toward semi-transmissive mirror 224.

Then, the beam that has reached semi-transmissive mirror 224 is divided in two, and one of the beams reaches polarization beam splitter BS3, and the other beam reaches polarization beam splitter BS2 via 214 plate 226.

The beam (interference light) separated by polarization at polarization beam splitter BS2 each reaches photodetectors 228a and 228b, and the optical intensity is converted into electrical signals in each of the photodetectors 228a and 228b. Further, the beam (interference light) separated by polarization at polarization beam splitter BS3 each reaches photodetectors 228c and 228d, and the optical intensity is converted into electrical signals in each of the photodetectors 228c and 228d.

The electrical signals output in the mariner described above are input into the controller (not shown), which measures positional information of wafer stage WST in the Y-axis direction based on the electrical signals.

Incidentally, the encoder main body for X position measurement is also configured similarly, and the positional information of wafer stage WST in the X-axis direction is measured using the diffraction light diffracted by the grating of grating 24 whose periodic direction is in the X-axis direction. Further, the encoder main body is arranged so that its optical axis is substantially orthogonal to the upper surface (the grating surface on which grating 24 is formed) of wafer stage WST. Incidentally, the configuration of the encoder main body is not limited to the ones described above, and encoder main bodies having other configurations can also be adopted, and depending on the configuration, the optical axis does not have to be arranged orthogonal to the upper surface of wafer stage WST.

As described above, according to the fifth embodiment, because grating 24 is arranged on the upper surface of the wafer stage, a highly precise measurement of wafer stage WST can be performed similar to the first to fourth embodiments.

Incidentally, in each of the embodiments above, the laser beam for measurement emitted from each encoder main body was designed to be incident on grating 24 at point IAa right under the center of exposure area IA, however, the present invention is not limited to this, and when such a setting is difficult, the laser beam can be designed to be incident on grating 24 at another point which is different from point IAa. Further, a position of the measurement point can be made different in encoder main body for X position measurement and encoder main body for Y position measurement. Furthermore, a plurality of at least one of the encoder main body for X position measurement and the encoder main body for Y position measurement can be arranged. In this case, a position of the measurement point of the plurality of encoder main bodies whose measurement direction is the same can be made different. Of the plurality of encoder main bodies, positional information of wafer stage WST in the θz direction can be measured by at least two encoder main bodies whose position of the measurement point differs in a direction besides the measurement direction.

Incidentally, in each of the embodiments above, at least a part of wafer table WTB is configured by a material (such as synthetic quartz) through which the laser beam for measurement of the encoder system could pass, however, the present invention is not limited to this, and, for example, wafer table WTB can be configured by a hollow frame member. In this case, a transmission member can be arranged in an opening section of the frame member to seal the inside, or the temperature inside can be made adjustable. Including the case where the wafer table is configured by a hollow frame member, in each of the embodiments above, a configuration can be employed where of the components of the encoder main body, a section which becomes a heat source (such as a light source, a detector and the like) and a section which does not become a heat source (such as an optical system) are separated, and both sections are connected by an optical fiber.

Further, in the first to third and fifth embodiments above, grating 24 was arranged on the upper surface of wafer table WTB or wafer stage WST, however, the present invention is not limited to this, and, for example, the grating can be arranged on the lower surface of the cover glass or on the rear surface of the wafer holder. Furthermore, instead of arranging a protective member such as a cover glass, for example, the wafer holder can be used as a substitute.

Incidentally, in each of the embodiments above, the case has been described where the exposure apparatus is equipped with a single wafer stage, however, the present invention is not limited to this, and the present invention can also be applied to an exposure apparatus equipped with a plurality of wafer stages, as disclosed in, for example, U.S. Pat. No. 6,590,634 description, U.S. Pat. No. 5,969,441 description, U.S. Pat. No. 6,208,407 description and the like. Further, for example, as disclosed in U.S. Pat. No. 6,897,963 description, the present invention can also be applied to an exposure apparatus equipped with a wafer stage, and a stage unit including a measurement stage which can move independently from the wafer stage.

Incidentally, the present invention can also be applied to a liquid immersion exposure apparatus whose details are disclosed in, for example, the pamphlet of International Publication No. 2004/053955 and the corresponding U.S. Patent Application Publication No. 2005/0259234 description and the like.

Further, the projection optical system in the exposure apparatus of each of the embodiments above is not limited only to a reduction system, but also can be either an equal magnifying system or a magnifying system, and the projection optical system is not limited only to a dioptric system, but also can be either a catoptric system or a catodioptric system, and the projected image can be either an inverted image or an upright image. Furthermore, exposure area IA previously described is an on-axis area including optical axis AX within the field of projection optical system PL, however, it can also be an off-axis area that does not include optical axis AX similar to the in-line type catodioptric system whose details are disclosed in, for example, the pamphlet of International Publication No. 004/107011. Further, the shape of exposure area IA is not limited to a rectangle, and, for example, a circular arc, a trapezoid, or a parallelogram is also preferable.

Further, illumination light IL is not limited to the ArF excimer laser beam (wavelength 193 nm), and illumination light IL can also be an ultraviolet light such as a KrF excimer laser beam (wavelength 248 nm) or a vacuum-ultraviolet light such as an $F_2$ laser beam (wavelength 157 nm). Further, as disclosed in, for example, U.S. Pat. No. 7,023,610 description, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a non-linear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, the present invention can be preferably applied to an EUV exposure apparatus that generates an EUV (Extreme Ultraviolet) light in a soft X-ray region (e.g. a wavelength range from 5 to 15 nm) with an SOR or a plasma laser serving as a light source, and uses a total reflection reduction optical system designed under the exposure wavelength (e.g. 13.5 nm) and a reflective mask. Besides such an apparatus, the present invention can also be applied to an exposure apparatus that uses charged particle beams such as an electron beam or an ion beam.

Further, in each of the embodiments above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, as disclosed in, for example, the pamphlet of International Publication No. 2001/035168, the present invention can also be applied to an exposure apparatus (lithography system) that forms line-and-space patterns on a wafer by forming interference fringes on the wafer.

Moreover, as disclosed in, for example, U.S. Pat. No. 6,611,316 description, the present invention can also be applied to an exposure apparatus that synthesizes two reticle patterns via a projection optical system and almost simultaneously performs double exposure of one shot area by one scanning exposure.

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in each of the embodiments above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied to an exposure apparatus for transferring a liquid crystal display device pattern onto a rectangular glass plate and an exposure apparatus for producing organic ELs, thin magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the movable body system of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus for specimen or a wire bonding apparatus in other precision machines.

Further, the exposure apparatus (the pattern forming apparatus) of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of the various publications, the pamphlets of the International Publications, and the U.S. Patent Application Publication descriptions and the U.S. patent descriptions that are cited in the embodiment above and related to exposure apparatuses and the like are each incorporated herein by reference.

Next, an embodiment of a device manufacturing method in which the exposure apparatus (pattern forming apparatus) described above is used in a lithography process will be described.

Figure 10:
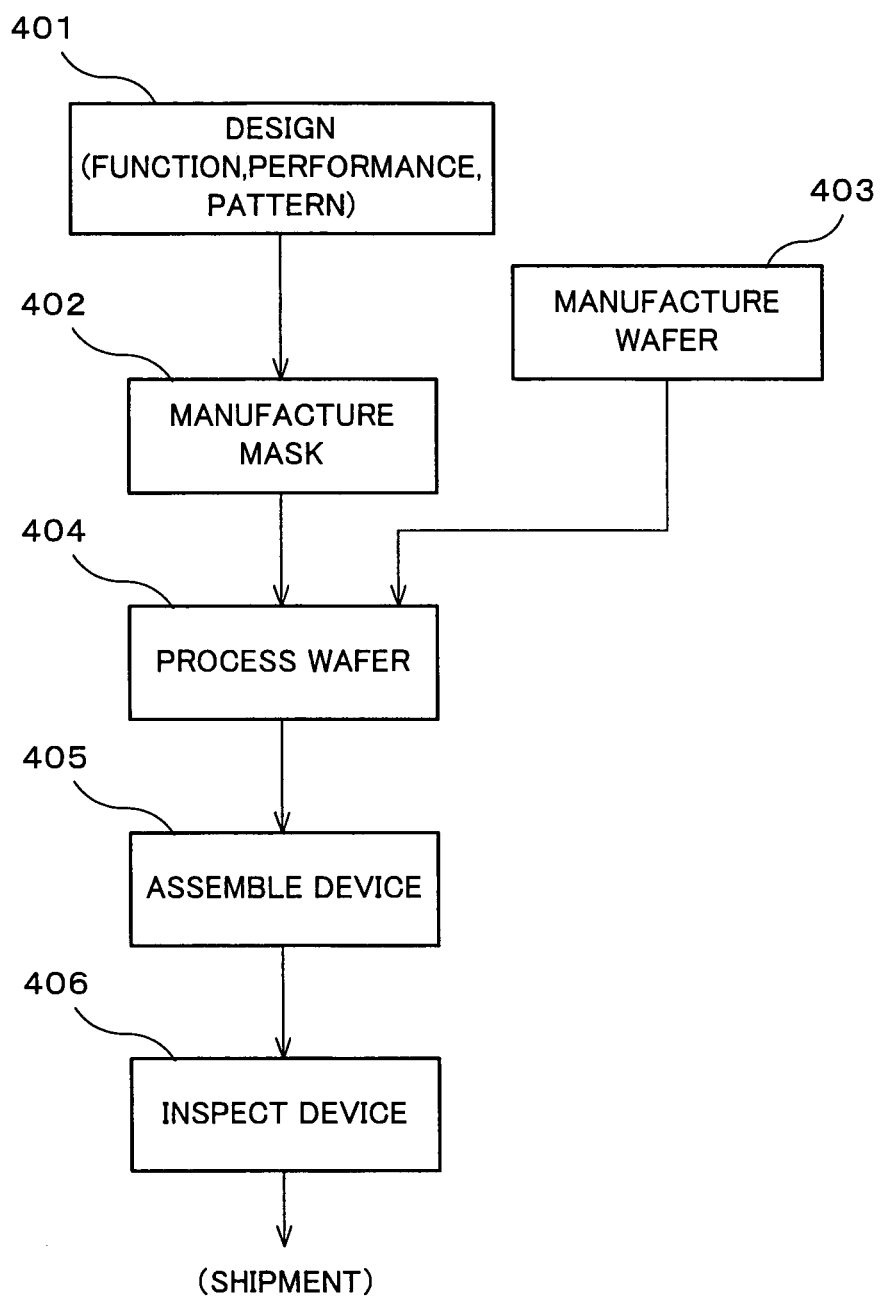
FIG. 10 is a flow chart for explaining an embodiment of the device manufacturing method.

FIG. 10 shows a flowchart of an example when manufacturing a device (a semiconductor chip such as an IC or an LSI, a liquid crystal panel, a CCD, a thin film magnetic head, a micromachine, and the like). As is shown in FIG. 10, first of all, in step 401 (a design step), function and performance design of device (such as circuit design of semiconductor device) is performed, and pattern design to realize the function is performed. Then, in step 402 (a mask making step), a mask (reticle) is made on which the circuit pattern that has been designed is formed. Meanwhile, in step 403 (a wafer fabrication step), wafers are manufactured using materials such as silicon.

Next, in step 404 (a wafer processing step), the actual circuit and the like are formed on the wafer by lithography or the like in a manner that will be described later, using the mask (reticle) and the wafer prepared in steps 401 to 403. Then, in step 405 (a device assembly step), device assembly is performed using the wafer processed in step 404. Step 405 includes processes such as the dicing process, the bonding process, and the packaging process (chip encapsulation), and the like when necessary.

Finally, in step 406 (an inspection step), tests on operation, durability, and the like are performed on the devices made in step 405. After these steps, the devices are completed and shipped out. After these processes, the devices are completed and are shipped out.

Figure 11:
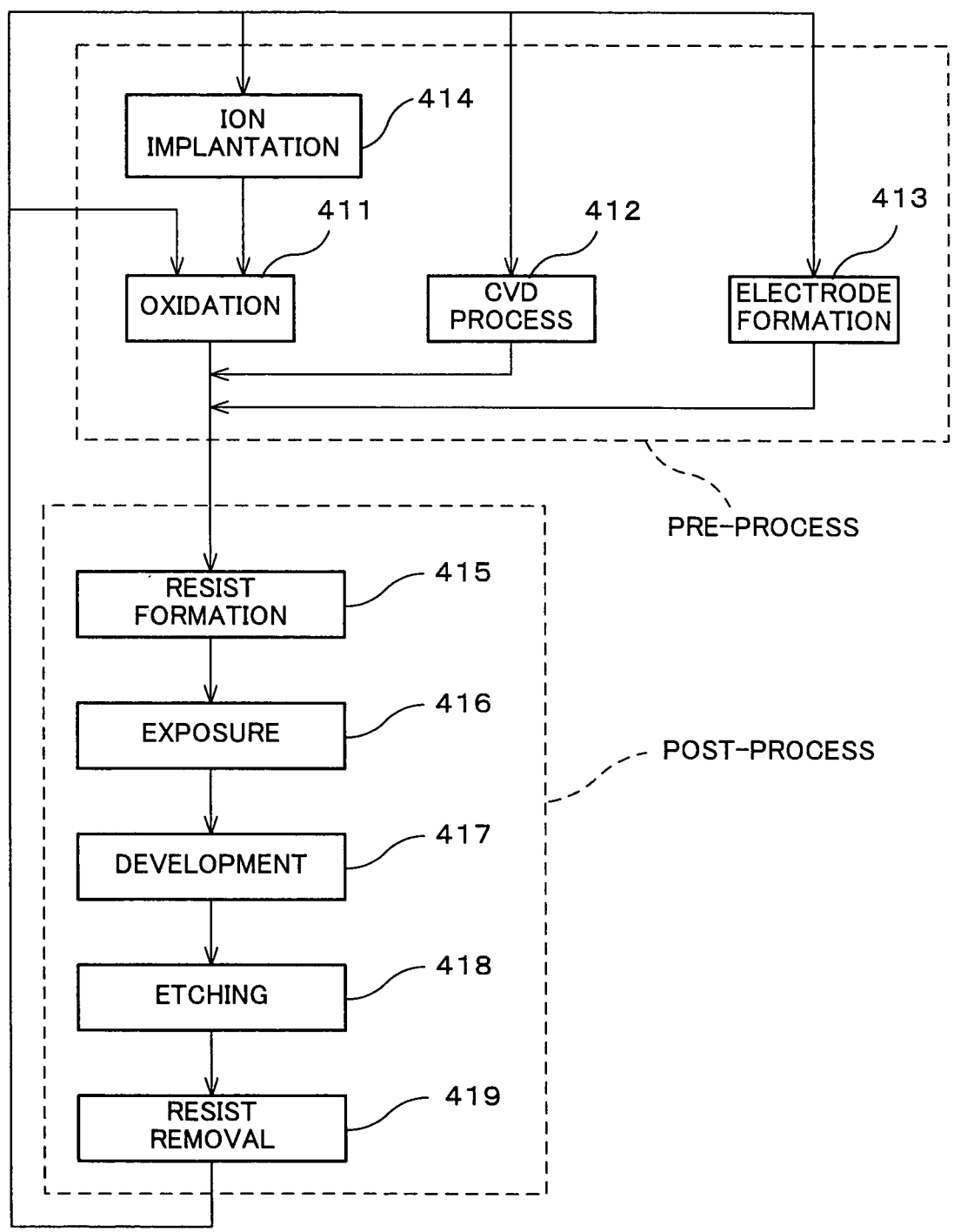
FIG. 11 is a flow chart that shows a concrete example of step 404 in FIG. 10.

FIG. 11 is a flowchart showing a detailed example of step 404 described above. In FIG. 11, in step 411 (an oxidation step), the surface of the wafer is oxidized. In step 412 (a CDV step), an insulating film is formed on the wafer surface. In step 413 (an electrode formation step), an electrode is formed on the wafer by deposition. In step 414 (an ion implantation step), ions are implanted into the wafer. Each of the above steps 411 to step 414 constitutes the preprocess in each step of wafer processing, and the necessary processing is chosen and is executed at each stage.

When the above-described preprocess ends in each stage of wafer processing, post-process is executed as follows. First of all, in the post-process, first in step 415 (a resist formation step), a photosensitive agent is coated on the wafer. Then, in step 416 (an exposure step), the circuit pattern of the mask (reticle) is transferred on a wafer by the exposure apparatus (pattern formation apparatus) and the exposure method (pattern formation method) described above. Next, in step 417 (a development step), the wafer that has been exposed is developed, and in step 418 (an etching step), an exposed member of an area other than the area where resist remains is removed by etching. Then, in step 419 (a resist removing step), when etching is completed, the resist that is no longer necessary is removed.

By repeatedly performing the pre-process and the post-process, multiple circuit patterns are formed on the wafer.

By using the device manufacturing method of the embodiment described above, because the exposure apparatus (pattern formation apparatus) in the embodiment above and the exposure method (pattern formation method) thereof are used in the exposure step (step 416), exposure with high throughput can be performed while maintaining the high overlay accuracy. Accordingly, the productivity of highly integrated microdevices on which fine patterns are formed can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes a substrate with an illumination beam via a projection optical system, the apparatus comprising:
    a frame structure that supports the projection optical system;
    a stage system which has a substrate stage placed under the projection optical system that is supported by the frame structure and an electromagnetic motor coupled to the substrate stage, and which moves the substrate by driving the substrate stage by the electromagnetic motor, the substrate stage including a substrate mounting portion, the substrate being mounted on an upper side of the substrate mounting portion, and a grating surface being placed on a lower side of the substrate mounting portion and having a grating area where a grating is formed; and
    an encoder system which has an optical member supported to be placed lower than the grating surface by the frame structure, and which irradiates the grating surface with a measurement beam from below via the optical member to measure positional information of the substrate stage, the optical member facing the grating surface as the substrate stage is placed facing the projection optical system, wherein
    the grating surface is moved relative to the optical member in a first direction and a second direction orthogonal to an optical axis of the projection optical system and orthogonal to each other as the substrate stage moves,
    the measurement beam is irradiated on the grating so that a measurement point irradiated with the measurement beam is not moved off from the grating area which is moved relative to the optical member, with respect to the first and the second directions, during at least an exposure operation of the substrate, and
    the measurement point is located under an exposure area on which the illumination beam is irradiated via the projection optical system and within the exposure area with respect to the first and the second directions.

2. The exposure apparatus according to claim 1, wherein the measurement point is located under a center of the exposure area or in the vicinity of a point under the center.

3. The exposure apparatus according to claim 1, wherein the measurement point is located at a predetermined point where the substrate stage should be positioned or in the vicinity of the point.

4. The exposure apparatus according to claim 1, wherein the encoder system irradiates the grating with a plurality of measurement beams including the measurement beam via the optical member and measures positional information of the substrate stage in different directions.

5. The exposure apparatus according to claim 4, wherein the plurality of measurement beams are respectively irradiated on a plurality of measurement points including the measurement point that are at different positions under the exposure area.

6. The exposure apparatus according to claim 5, wherein the plurality of the measurement points include a pair of measurement points that are located substantially symmetrically with respect to an exposure center under the exposure area or located substantially at an equal distance from the exposure center.

7. The exposure apparatus according to claim 1, further comprising:
a base member at which the substrate stage is placed, wherein
the electromagnetic motor includes a planar motor that drives the substrate stage supported by levitation above the base member.

8. The exposure apparatus according to claim 7, wherein the optical member is placed lower than an upper surface of the base member.

9. The exposure apparatus according to claim 7, wherein the substrate stage is supported by levitation by a magnetic force.

10. The exposure apparatus according to claim 7, wherein the base member has a light-transmitting section, which the measurement beam passes through, the light-transmitting section being located on an upper surface of the base member.

11. The exposure apparatus according to claim 1, wherein the holding member has a protective member that covers the grating.

12. The exposure apparatus according to claim 11, wherein the protective member includes a thin film.

13. A device manufacturing method, comprising:
exposing a substrate using the exposure apparatus according to claim 1; and
developing the exposed substrate.

14. The exposure apparatus according to claim 1, wherein the grating is a reflective two-dimensional grating, and
the encoder system detects a measurement beam reflected off the reflective two-dimensional grating via the optical member.

15. The exposure apparatus according to claim 14, wherein a grating area where the reflective two-dimensional grating is formed is larger than a mounting area of the substrate mounting portion.

16. The exposure apparatus according to claim 15, further comprising:
a support member supported by the frame structure and placed under the projection optical system, wherein
the optical member is arranged at the support member.

17. The exposure apparatus according to claim 16, wherein the optical member is arranged inside the support member,
the support member has a light transmitting section located above the optical member, and
the measurement beam passes through the light transmitting section to be irradiated on the grating surface.

18. The exposure apparatus according to claim 16, wherein the support member is supported by the frame structure only at one end side of the support member in the first direction, and
the optical member is arranged at the support member apart from the one end side in the first direction so that the optical member is placed right under the projection optical system.

19. The exposure apparatus according to claim 18, wherein the optical member includes at least a part of an optical system that irradiates the grating surface with the measurement beam obliquely.

20. The exposure apparatus according to claim 19, wherein the encoder system has a light source that emits the measurement beam and a detector that detects the measurement beam reflected, and
at least one of the light source and the detector is coupled to the optical member via an optical fiber in order to be placed apart from the optical member.

21. The exposure apparatus according to claim 18, wherein the encoder system irradiates the grating surface with a plurality of measurement beams that include the measurement beam via the optical member, and measures positional information of the substrate stage in different directions, the different directions including at least the first and the second directions.

22. The exposure apparatus according to claim 21, wherein the plurality of measurement beams include another measurement beam that is irradiated on another measurement point which is at a different position from the measurement point in at least one of the first and the second directions under the exposure area.

23. The exposure apparatus according to claim 22, wherein a plurality of measurement points including the measurement point and the another measurement point respectively irradiated with the plurality of measurement beams are located under the exposure area and within a region corresponding to the exposure area in the first and the second directions.

24. The exposure apparatus according to claim 23, wherein the plurality of measurement points include at least one measurement point located under a center of the exposure area or in the vicinity of a point under the center.

25. The exposure apparatus according to claim 23, wherein the plurality of measurement points include a pair of measurement points located substantially symmetrically with respect to an exposure center or located substantially at an equal distance from the exposure center under the exposure area.

26. The exposure apparatus according to claim 25, wherein the plurality of measurement points include at least one measurement point different from the pair of measurement points that is located under the center of the exposure area or in the vicinity of a point under the center.

27. The exposure apparatus according to claim 23, wherein the plurality of measurement points are at different positions from each other in at least one of the first and the second directions.

28. The exposure apparatus according to claim 23, wherein the substrate stage is configured to form a space under the grating surface, and
each of the plurality of measurement beams passes through the space and is irradiated on the grating surface.

29. The exposure apparatus according to claim 28, wherein the electromagnetic motor has a planar motor that drives the substrate stage, and
the stage system supports the substrate stage by levitation.

30. The exposure apparatus according to claim 29, wherein the substrate stage is supported by levitation by a magnetic force.

31. The exposure apparatus according to claim 30, wherein the substrate stage is supported by levitation on a predetermined plane above the optical member.

32. An exposure method of exposing a substrate with an illumination beam via a projection optical system, the method comprising:
moving the substrate by a stage system which has a substrate stage and an electromagnetic motor coupled to the substrate stage, the substrate stage including a substrate mounting portion, the substrate being mounted on an upper side of the substrate mounting portion, and a grating surface being placed on a lower side of the substrate mounting portion and having a grating area where a grating is formed; and measuring positional information of the substrate stage by an encoder system having an optical member which is supported to be placed lower than the grating surface by a frame structure that supports the projection optical system, the encoder system irradiating the grating surface with a measurement beam from below via the optical member that faces the grating surface as the substrate stage is placed facing the projection optical system; and controlling driving of the substrate stage by the electromagnetic motor based on the positional information measured by the encoder system, wherein the grating surface is moved relative to the optical member in a first and a second direction orthogonal to an optical axis of the projection optical system and orthogonal to each other as the substrate stage moves, the measurement beam is irradiated on the grating so that a measurement point irradiated with the measurement beam is not moved off from the grating area which is moved relative to the optical member, with respect to the first and the second directions, during at least an exposure operation of the substrate, and the measurement point is located under an exposure area on which the illumination beam is irradiated via the projection optical system and within the exposure area with respect to the first and the second directions.

33. The exposure method according to claim 32, wherein the measurement point is located under a center of the exposure area or in the vicinity of a point under the center.

34. The exposure method according to claim 32, wherein the measurement point is located at a predetermined point where the substrate stage should be positioned or in the vicinity of the point.

35. The exposure method according to claim 32, wherein positional information the substrate stage in different directions is measured by irradiating a plurality of measurement beams including the measurement beam on the grating via the optical member.

36. The exposure method according to claim 35, wherein the plurality of measurement beams are respectively irradiated on a plurality of measurement points including the measurement point that are at different positions under the exposure area.

37. The exposure method according to claim 36, wherein the plurality of measurement points include a pair of measurement points that are located substantially symmetrically with respect to an exposure center under the exposure area or located substantially at an equal distance from the exposure center.

38. The exposure method according to claim 21, wherein the substrate stage is supported by levitation above a base member, and the electromagnetic motor includes a planar motor that drives the substrate stage.

39. The exposure method according to claim 38, wherein the optical member is placed lower than an upper surface of the base member.

40. The exposure method according to claim 38, wherein the substrate stage is supported by levitation by a magnetic force.

41. The exposure method according to claim 38, wherein the measurement beam is irradiated on the grating via a light-transmitting section located on an upper surface of the base member.

42. The exposure method according to claim 32, wherein the grating is covered with a protective member.

43. The exposure method according to claim 42, wherein the protective member includes a thin film.

44. A device manufacturing method, comprising:
exposing a substrate using the exposure method according to claim 32; and
developing the exposed substrate.

45. The exposure method according to claim 32, wherein the grating is a reflective two-dimensional grating, and
a measurement beam reflected off the reflective two-dimensional grating is detected via optical member.

46. The exposure method according to claim 45, wherein a grating area where the reflective two-dimensional grating is formed is larger than a mounting area of the substrate mounting portion.

47. The exposure method according to claim 46, wherein the optical member is arranged at a support member that is supported by the frame structure and placed under the projection optical system.

48. The exposure method according to claim 47, wherein the support member is supported by the frame structure only at one end side of the support member in the first direction, and the optical member is arranged at the support member apart from the one end side in the first direction so that the optical member is placed right under the projection optical system.

49. The exposure method according to claim 48, wherein the optical member includes at least a part of an optical system that irradiates the grating surface with the measurement beam obliquely.

50. The exposure method according to claim 49, wherein the optical member is coupled to at least one of a light source that emits the measurement beam and a detector that detects the measurement beam reflected, via an optical fiber.

51. The exposure method according to claim 48, wherein the grating surface is irradiated with a plurality of measurement beams that include the measurement beam, and positional information of the substrate stage is measured in different directions including at least the first and the second directions.

52. The exposure method according to claim 51, wherein the plurality of measurement beams include another measurement beam that is irradiated on another measurement point which is at a different position from the measurement point in at least one of the first and the second directions under the exposure area.

53. The exposure method according to claim 52, wherein a plurality of measurement points including the measurement point and the another measurement point respectively irradiated with the plurality of measurement beams are located under the exposure area within a region corresponding to the exposure area in the first and the second directions.

54. The exposure method according to claim 53, wherein the plurality of measurement points include at least one measurement point located under a center of the exposure area or in the vicinity of a point under the center.

55. The exposure method according to claim 53, wherein the plurality of measurement points include a pair of measurement points located substantially symmetrically with respect to an exposure center or located substantially at an equal distance from the exposure center under the exposure area.

56. The exposure method according to claim 55, wherein the plurality of measurement points include at least one measurement point different from the pair of measurement points that is located under the center of the exposure area or in the vicinity of a point under the center.

57. The exposure method according to claim 53, wherein the plurality of measurement points are at different positions from each other in at least one of the first and the second directions.

58. The exposure method according to claim 53, wherein each of the plurality of measurement beams passes through a space of the substrate stage formed under the grating surface, and is irradiated on the grating surface.

59. The exposure method according to claim 58, wherein the electromagnetic motor has a planar motor that drives the substrate stage, and
the substrate stage is supported by levitation by the stage system.

60. The exposure method according to claim 59, wherein the substrate stage is supported by levitation by a magnetic force.

61. The exposure method according to claim 60, wherein the substrate stage is supported by levitation on a predetermined plane above the optical member.

62. A manufacturing method of an exposure apparatus that exposes a substrate with an illumination beam via a projection optical system, the method comprising:
supporting the projection optical system by a frame structure;
providing a stage system which has a substrate stage and an electromagnetic motor coupled to the substrate stage, and which moves the substrate by driving the substrate stage by the electromagnetic motor, the substrate stage including a substrate mounting portion, the substrate being mounted on an upper side of the substrate mounting portion, and a grating surface being placed on a lower side of the substrate mounting portion and having a grating area where a grating is formed; and
providing an encoder system which has an optical member supported to be placed lower than the grating surface by the frame structure, and measures positional information of the substrate stage, the encoder system irradiating the grating surface with a measurement beam from below via the optical member facing the grating surface as the substrate stage is placed facing the projection optical system, wherein
the grating surface is moved relative to the optical member in a first and a second direction orthogonal to an optical axis of the projection optical system and orthogonal to each other as the substrate stage moves,
the measurement beam is irradiated on the grating so that a measurement point irradiated with the measurement beam is not moved off from the grating area which is moved relative to the optical member, with respect to the first and the second directions, during at least an exposure operation of the substrate, and
the measurement point is located under an exposure area on which the illumination beam is irradiated via the projection optical system and within the exposure area with respect to the first and the second directions.

63. The manufacturing method according to claim 62, wherein
the measurement point is located under a center of the exposure area or in the vicinity of a point under the center.

64. The manufacturing method according to claim 62, wherein
the measurement point is located at a predetermined point where the substrate stage should be positioned or in the vicinity of the point.

65. The manufacturing method according to claim 62, wherein
the encoder system irradiates the grating with a plurality of measurement beams including the measurement beam via the optical member and measures positional information of the substrate stage in different directions.

66. The manufacturing method according to claim 62, further comprising:
providing a base member at which the substrate stage is placed, wherein
the electromagnetic motor includes a planar motor that moves the substrate stage supported by levitation above the base member.

67. The manufacturing method according to claim 66, wherein
the optical member is placed lower than an upper surface of the base member.

68. The manufacturing method according to claim 62, wherein
the grating is covered with a protective member.

69. The manufacturing method according to claim 62, wherein
the grating is a reflective two-dimensional grating, and
the encoder system detects a measurement beam reflected off the reflective two-dimensional grating via the optical member.

70. The manufacturing method according to claim 69, wherein
a grating area where the reflective two-dimensional grating is formed is larger than a mounting area of the substrate mounting portion.

71. The manufacturing method according to claim 70, further comprising:
providing a support member supported by the frame structure and placed under the projection optical system, wherein
the optical member is arranged at the support member.

72. The manufacturing method according to claim 71, wherein
the support member is supported by the frame structure only at one end side of the support member in the first direction, and
the optical member is arranged at the support member apart from the one end side in the first direction so that the optical member is placed right under the projection optical system.

73. The manufacturing method according to claim 72, wherein
the optical member includes at least a part an optical system that irradiates the grating surface with the measurement beam obliquely.

74. The manufacturing method according to claim 73, wherein
the optical member is coupled to at least one of a light source that emits the measurement beam and a detector that detects the measurement beam reflected, via an optical fiber.

75. The manufacturing method according to claim 72, wherein the grating surface is irradiated with a plurality of measurement beams that include the measurement beam, and positional information of the substrate stage is measured in different directions including at least the first and the second directions.

76. The manufacturing method according to claim 75, wherein
the plurality of measurement beams include another measurement beam that is irradiated on another measurement point which is at a different position from the measurement point in at least one of the first and the second directions under the exposure area.

77. The manufacturing method according to claim 76, wherein
a plurality of measurement points including the measurement point and the another measurement point respectively irradiated with the plurality of measurement beams are located under the exposure area within the exposure area in the first and the second directions.

78. The manufacturing method according to claim 77, wherein
the plurality of measurement points include at least one measurement point located under a center of the exposure area or in the vicinity of a point under the center.

79. The manufacturing method according to claim 77, wherein
the plurality of measurement points include a pair of measurement points located substantially symmetrically with respect to an exposure center or located substantially at an equal distance from the exposure center under the exposure area.

80. The manufacturing method according to claim 79, wherein
the plurality of measurement points include at least one measurement point different from the pair of measurement points that is located under the center of the exposure area or in the vicinity of a point under the center.

81. The manufacturing method according to claim 77, wherein
the plurality of measurement points are at different positions from each other in at least one of the first and the second directions.

82. The manufacturing method according to claim 77, wherein
each of the plurality of measurement beams passes through a space of the substrate stage formed under the grating surface, and is irradiated on the grating surface.

83. The manufacturing method according to claim 82, wherein
the electromagnetic motor has a planar motor that drives the substrate stage, and
the stage system supports the substrate stage by levitation.

84. The manufacturing method according to claim 83, wherein
the substrate stage is supported by levitation by a magnetic force.

85. The manufacturing method according to claim 84, wherein
the substrate stage is supported by levitation on a predetermined plane above the optical member.

* * * * *